US008541057B2

(12) United States Patent
Beatty

(10) Patent No.: US 8,541,057 B2
(45) Date of Patent: Sep. 24, 2013

(54) CYCLOHEXANE OXIDATION PROCESS BYPRODUCT DERIVATIVES AND METHODS FOR USING THE SAME

(75) Inventor: Richard P. Beatty, Newark, DE (US)

(73) Assignee: Invista North America S.A R.L., Wilmington, DE (US)

( * ) Notice: Subject to any disclaimer, the term of this patent is extended or adjusted under 35 U.S.C. 154(b) by 124 days.

(21) Appl. No.: 13/140,065

(22) PCT Filed: Dec. 11, 2009

(86) PCT No.: PCT/US2009/067634
§ 371 (c)(1), (2), (4) Date: Oct. 27, 2011

(87) PCT Pub. No.: WO2010/071759
PCT Pub. Date: Jun. 24, 2010

(65) Prior Publication Data
US 2012/0064252 A1    Mar. 15, 2012

Related U.S. Application Data

(60) Provisional application No. 61/138,697, filed on Dec. 18, 2008, provisional application No. 61/148,433, filed on Jan. 30, 2009, provisional application No. 61/183,131, filed on Jun. 2, 2009.

(51) Int. Cl.
*B05D 3/10* (2006.01)

(52) U.S. Cl.
USPC ........ 427/344; 427/384; 427/385.5; 427/387; 427/402; 524/284

(58) Field of Classification Search
None
See application file for complete search history.

(56) References Cited

U.S. PATENT DOCUMENTS

| | | | |
|---|---|---|---|
| 3,365,490 A | | 1/1968 | Arthur et al. |
| 4,005,051 A * | | 1/1977 | Brunner ........................ 524/310 |
| 4,273,179 A | | 6/1981 | Gardikes |
| 4,525,574 A | | 6/1985 | Altounian |
| 5,981,769 A * | | 11/1999 | Baur et al. .................... 549/266 |
| 6,008,418 A * | | 12/1999 | Baur et al. .................... 568/853 |
| 6,288,286 B1 * | | 9/2001 | Stein et al. ................... 568/864 |
| 6,313,358 B1 * | | 11/2001 | Breitscheidel et al. ....... 568/864 |
| 6,407,294 B1 * | | 6/2002 | Breitscheidel et al. ....... 568/864 |
| 6,727,395 B1 * | | 4/2004 | Stein et al. ................... 568/864 |
| 7,226,895 B2 | | 6/2007 | Xiang |
| 2007/0112225 A1 * | | 5/2007 | Sirch et al. ................... 568/864 |
| 2008/0207958 A1 * | | 8/2008 | Haunert et al. .............. 568/862 |
| 2009/0048471 A1 * | | 2/2009 | Ii et al. ......................... 568/884 |
| 2011/0201848 A1 * | | 8/2011 | Ii et al. ......................... 568/833 |
| 2011/0263907 A1 * | | 10/2011 | Abillard et al. .............. 568/852 |
| 2012/0101009 A1 * | | 4/2012 | Beatty ........................... 507/103 |

FOREIGN PATENT DOCUMENTS
WO    WO02/16659    2/2002

* cited by examiner

*Primary Examiner* — Erma Cameron
(74) *Attorney, Agent, or Firm* — Robert B. Furr, Jr.

(57) ABSTRACT

Disclosed are ester compositions, solvents, cleaning formulations, curing agents, reactive diluent solvents, controlled acid function release agents, polyol monomers, drilling mud and methods of making and using the same. Disclosed compositions include: a) about 10 to 60 weight percent methyl hydroxycaproate, b) about 20 to 80 weight percent dimethyl adipate;

c) about 1 to 15 wt % of dimethyl glutarate;

d) about 0.1 to 5 wt % of dimethyl succinate;

e) about 0.1 to 7 wt % of at least one cyclohexanediot;

and f) less than about 20 wt % oligomeric esters.

33 Claims, No Drawings

CYCLOHEXANE OXIDATION PROCESS BYPRODUCT DERIVATIVES AND METHODS FOR USING THE SAME

CROSS-REFERENCE TO RELATED APPLICATIONS

This application claims the benefit of the filing dates of U.S. Provisional Application No. 61/138,697 filed on Dec. 18, 2008; U.S. Provisional Application No. 61/148,433 filed on Jan. 30, 2009; and U.S. Provisional Application No. 61/183,131 filed on Jun. 2, 2009; the entire contents of which are incorporated herein by reference. This application is also related by disclosure of related subject matter to PCT Application No. PCT/US2009/067634, filed on Dec. 11, 2009.

BACKGROUND

As petroleum-based materials escalate in price and environmental pressures increase, there is a growing need to responsibly utilize, to the greatest extent possible, all products from petrochemical processes, which includes the desired main products as well as co-products. Co-products are often treated as "waste" materials of no value.

It is known in the manufacture of adipic acid or caprolactam from cyclohexane that co-product streams result because the chemical transformations do not proceed perfectly in 100% yield. These co-product streams contain a variety of molecules having functionalities which include, among others, the alcohol, alkene, carboxylic acid, lactone, ester, and ketone groups. It is known to use some co-product streams for their fuel value. In such uses, there is no recognition or recovery of value for the functionality present in the co-product stream. As a result, most of the co-product stream from adipic acid manufacture remains underutilized.

Manufacture of adipic acid from cyclohexane generally involves two steps. First, cyclohexane is oxidized using air to a mixture of cyclohexanol (A) and cyclohexanone (K), the mixture being referred to as KA. Second, KA is oxidized using nitric acid to adipic acid. The current disclosure is focused on utilization of co-product streams from the first of these two steps, the oxidation of cyclohexane to KA. This "cyclohexane oxidation" step is also performed in manufacture of caprolactam from cyclohexane.

In the known cyclohexane oxidation processes, cyclohexane is generally oxidized with oxygen or a gas containing oxygen, at low conversion, to produce an intermediate stream containing cyclohexanol (A), cyclohexanone (K), and cyclohexyl hydroperoxide (CHHP) in cyclohexane. CHHP is an important intermediate in oxidation of cyclohexane to KA and various processes are known in the art to optimize conversion of CHHP to KA, in order to maximize yield of KA. In addition to K, A, and CHHP, cyclohexane oxidation produces co-products. In some cases, it has been found that these co-products interfere with subsequent processing to convert CHHP to KA. It is known that at least some of the interfering co-products can be removed by contacting the intermediate stream containing K, A, and CHHP with water or caustic, for example as described in U.S. Pat. No. 3,365,490, which is incorporated herein by reference. This contacting, or extraction results in a two-phase mixture that, after phase separation, yields a purified cyclohexane stream containing K, A, and CHHP (which can be subjected to known high-yield processes to convert CHHP to KA) and a co-product water stream. The co-product water stream ("Water Wash") contains various mono- and di-acids, hydroxy-acids, and other oxidation co-products formed during the initial oxidation of cyclohexane.

Regardless of whether water wash is performed as an intermediate step, the stream containing K, A, and CHHP is further processed by methods well known in the art, to complete conversion of CHHP to K and A. The resulting mixture is then refined, again by methods well known in the art, to recover unconverted cyclohexane for recycle and to obtain purified K and A for subsequent oxidation to adipic acid or conversion to caprolactam. The high-boiling distillation bottoms from this refining operation are known as non-volatile residue, "NVR."

To summarize, the co-product streams, sometimes referred to herein as "by-product" streams, available from a cyclohexane oxidation process include "Water Wash" (the aqueous stream produced by water extraction of cyclohexane oxidate) and "NVR" (the high-boiling distillation bottoms from KA refining). Concentration of Water Wash by removal of at least some of the water produces a stream known as "COP Acid."

"Water Wash", "COP Acid", and "NVR" are known to contain both mono- and poly-functional materials, mainly with the functional groups comprising acids, peroxides, ketones, alcohols, and esters. Other functional groups such as aldehyde, lactone, and alkene are also known to be present. Multiple functional groups may be combined in a single molecule, such as in a hydroxyacid, for example hydroxycaproic acid or hydroxyvaleric acid. In general, the acid functional group is at one end of a linear hydrocarbyl chain, and the hydroxy group may be present in various positions along the chain. Known examples of hydroxyacids include 6-hydroxycaproic acid, 5-hydroxyvaleric acid, 3-hydroxyvaleric acid, and 3-hydroxypropionic acid. Similarly, known examples of simple mono-acids include formic acid, acetic acid, propionic acid, butyric acid, valeric acid, and caproic acid. Known examples of diacids include succinic acid, glutaric acid, and adipic acid. Known examples of keto-acids include 4-oxo valeric acid (also known as levulinic acid) and 5-oxo caproic acid. Known examples of alcohols include cyclohexanol, 1-propanol, 1-butanol, 1-pentanol, and various diols such as 1,2- 1,3-, and 1,4-cyclohexanediols, various butanediol isomers, and various pentanediol isomers.

The chemical complexity of "Water Wash", "COP Acid", and "NVR" introduce difficulties to obtain pure, commercially-useful chemicals from these streams. Efforts to develop processes to obtain useful materials from these streams are known and varied.

In view of the foregoing disclosures, it would be desirable to provide a simple process for the recovery of ester-based solvents from "Water Wash", "COP Acid", and/or "NVR" which uses economically sound and practical high recovery means. It would also be desirable to provide an effective solvent or novel chemical intermediate.

SUMMARY

Embodiments of the present disclosure provide for ester compositions, solvents, cleaning formulations, curing agents, reactive diluent solvents, controlled acid function release agents, polyol monomers, drilling mud, methods of making each of the above, methods of using each of the above, methods for hardening a friable substrate, and the like.

Embodiments of the composition, among others, include obtaining a composition from a process applied to a starting material, the starting material is a portion of products from a cyclohexane oxidation process, wherein the portion of products has free acid functional groups, wherein the starting material is selected from the group consisting of: a water extract (Water Wash), a concentrated water extract (COP Acid), a non-volatile residue (NVR), and a combination thereof; wherein the process includes at least the steps of: converting free acid functional groups of the products to monomeric esters and oligomeric esters, and converting oligomeric esters to monomeric esters.

Embodiments of the composition, among others, include obtaining a composition from a system applied to a starting material, wherein the starting material is a portion of products from a cyclohexane oxidation process, wherein the portion of products have free acid functional groups, wherein the starting material is selected from the group consisting of: a water extract (Water Wash), a concentrated water extract (COP Acid), a non-volatile residue (NVR), and a combination thereof; wherein the system includes at least the steps of: converting free acid functional groups of the products to monomeric esters and oligomeric esters, and converting oligomeric esters to monomeric esters.

Embodiments of the composition described herein can be used in solvents, cleaning formulations, curing agents, reactive diluent solvents, controlled acid function release agents, polyol monomers, drilling mud, and the like. Embodiments of the present disclosure includes methods of using each of the following: ester compositions, solvents, cleaning formulations, curing agents, reactive diluent solvents, controlled acid function release agents, polyol monomers, drilling mud, and the like.

EMBODIMENTS

Embodiments of the composition can comprise:
a) about 10 to 60 weight percent methyl hydroxycaproate;
b) about 20 to 80 weight percent dimethyl adipate;
c) about 1 to 15 wt % of dimethyl glutarate;
d) about 0.1 to 5 wt % of dimethyl succinate;
e) about 0.1 to 7 wt % of at least one cyclohexanediol; and
f) less than about 20 wt % oligomeric esters.

The composition of embodiment 1 further comprising about 0.1 to 7 wt % of methyl 5-hydroxyvalerate.

In an embodiment, the composition may further comprise:
g) about 0.01 to 5 wt % of gamma butyrolactone; and
h) about 0.01 to 10 wt % of methyl levulinate.

The composition can be further processed to comprise about 50 to 100 weight percent methyl hydroxycaproate and about 0.01 to 2 weight percent dimethyl adipate. The composition can be further processed to comprise about 0.05 to 2 weight percent methyl hydroxycaproate and about 50 to 100 weight percent dimethyl adipate.

The compositions may be useful components in solvents, curing agents, drilling muds, paint removers, photoresist strippers for use in electronics manufacturing, graffiti removers and cleaners. Examples of end-uses for cleaners containing one or more of the compositions include consumer applications, institutional applications and industrial cleaning applications.

The compositions may be useful components in inks, resins, adhesives, sealants, composites and binder systems, and may also be useful as solvents for removing any of these.

The compositions may be useful as components of resins, for example, phenolic resins. Such phenolic resins may be useful as refractory binder systems or a foundry binder systems.

In addition to phenolic resins, the disclosed compositions may be useful as components of resins selected from the group consisting of: a polyester resin, a polyurethane resin, an epoxy resin, a phenoxy resin, a styrenic resin, a copolymer of a styrenic resin with maleic anhydride, an acrylonitrile or a combination of each, an acrylic resin, a methacrylic resin, a polyvinylbutyral resin, a vinylidene halide resin including a vinylidene fluoride, and a vinylic resin including a vinyl chloride, a vinyl acetate, and a combination thereof. Additionally, the disclosed compositions may be useful as components of resins including those selected from the group consisting of: a urethane, a urethane polymer, and a urethane copolymer.

Embodiments include methods for hardening a friable substrate comprising the steps of:
applying an aqueous solution comprising sodium silicate to said friable substrate;
curing said sodium silicate in contact with said friable substrate by applying one or more of the compositions of embodiments 1 to 5;
wherein the aqueous solution comprising sodium silicate and the one or more of the compositions of embodiments 1 to 5 are applied together, separately, or separately in sequence.

The friable substrate may be a component of a binder for foundry castings. The friable substrate may also be selected from the group consisting of: a soil, a grout, a drilling fluid, and a briquette.

The friable substrate may comprise waste metal, and the hardening method may produce a briquette containing waste metal.

Embodiments may further include compositions comprising:
a) about 10 to 60 weight percent methyl hydroxycaproate;
b) about 20 to 80 weight percent dimethyl adipate;
c) about 1 to 15 wt % of dimethyl glutarate;
d) about 0.1 to 5 wt % of dimethyl succinate;
e) about 0.1 to 7 wt % of cyclohexanediols;
f) about 0.1 to 7 wt % of methyl 5-hydroxyvalerate;
g) about 0.01 to 5 wt % of gamma butyrolactone; and
h) about 0.01 to 10 wt % of methyl levulinate.

Compositions may include polyesters prepared from the disclosed precursors. Examples include polyester polyols and polyester polyols with a co-solvent. Embodiments include polyester polyols with 3-ethoxypropionate co-solvent and ethyl 3-ethoxypropionate co-solvent.

DEFINITIONS

The term "hydroxyl value" indicates the total amount of residual hydroxyl groups present in the material. The hydroxyl value, also referred to herein as hydroxyl number, is reported as mg KOH/g, and is measured according to well known methods such as standard ASTM D 1957 or ASTM E1899.

The term "acid number" correspondingly indicates the concentration of carboxylic acid groups present in the material, and is reported in terms of mg KOH/g and measured according to well-known methods such as standard ASTM D 4662 or ASTM D1613.

The term "starting material", as it refers to any one of Water Wash, COP Acid, NVR, or a combination thereof, is a mixture that contains a liquid phase and may or may not contain a solid phase (settled or suspended). The amount of solid phase, if any, depends on composition (especially water concentration) and temperature. For example, COP Acid with 40% by weight water content is essentially liquid at 60° C. but may contain solid at 20° C. because the organic acids present in COP Acid are not completely soluble at 20° C. at this water concentration. In an embodiment, the starting material can be a Water Wash, a COP Acid, a NVR feed, or a combination (two or three of a Water Wash, a COP Acid, or a NVR) of these feeds. The starting material can include a portion of products from a cyclohexane oxidation, where the product can be a by-product, co-product, reactant, a combination thereof, or the like, of a cyclohexane oxidation process or system.

The term "aliphatic group" refers to a saturated or unsaturated linear or branched hydrocarbon group and encompasses alkyl, alkenyl, and alkynyl groups, for example.

The terms "alk" or "alkyl" refer to straight or branched chain hydrocarbon groups having 1 to 12 carbon atoms, for example 1 to 8 carbon atoms, such as methyl, ethyl, n-propyl, i-propyl, n-butyl, i-butyl, t-butyl, pentyl, hexyl, heptyl, n-octyl, dodecyl, amyl, 2-ethylhexyl, and the like. An alkyl group is optionally substituted, unless stated otherwise, with one or more groups, selected from, aryl (optionally substituted), heterocyclo (optionally substituted), carbocyclo (optionally substituted), halo, hydroxy, protected hydroxy, alkoxy (e.g., $C_1$ to $C_7$) (optionally substituted), poly(oxyalkylene) (e.g. ethoxylated or propoxylated groups), acyl (e.g., $C_1$ to $C_7$), aryloxy (optionally substituted), alkylester (optionally substituted), arylester (optionally substituted), alkanoyl (optionally substituted), aroyl (optionally substituted), carboxy, protected carboxy, cyano, nitro, amino, substituted amino, (monosubstituted)amino, (disubstituted)amino, protected amino, amido, lactam, urea, urethane, sulfonyl, and the like.

The term "alkenyl" refers to straight or branched chain hydrocarbon groups having 2 to 12 carbon atoms, for example 2 to 8 carbon atoms, and at least one double carbon to carbon bond (either cis or trans), such as ethenyl. An alkenyl group is optionally substituted, unless stated otherwise, with one or more groups, selected from aryl (including substituted aryl), heterocyclo (including substituted heterocyclo), carbocyclo (including substituted carbocyclo), halo, hydroxy, alkoxy (optionally substituted), poly(oxyalkylene) (e.g. ethoxylated or propoxylated groups), aryloxy (optionally substituted), alkylester (optionally substituted), arylester (optionally substituted), alkanoyl (optionally substituted), aroyl (optionally substituted), cyano, nitro, amino, substituted amino, amido, lactam, urea, urethane, sulfonyl, and the like.

The term "alkynyl" refers to straight or branched chain hydrocarbon groups having 2 to 12 carbon atoms, for example 2 to 8 carbon atoms, and at least one triple carbon to carbon bond, such as ethynyl. An alkynyl group is optionally substituted, unless stated otherwise, with one or more groups, selected from aryl (including substituted aryl), heterocyclo (including substituted heterocyclo), carbocyclo (including substituted carbocyclo), halo, hydroxy, alkoxy (optionally substituted), poly(oxyalkylene) (e.g. ethoxylated or propoxylated groups), aryloxy (optionally substituted), alkylester (optionally substituted), arylester (optionally substituted), alkanoyl (optionally substituted), aroyl (optionally substituted), cyano, nitro, amino, substituted amino, amido, lactam, urea, urethane, sulfonyl, and the like.

The term "cycloaliphatic" refers to a mono-, bi-, or tricyclic saturated ring that is fully saturated or partially unsaturated. Examples of such a group include cyclopropyl, cyclobutyl, cyclopentyl, cyclohexyl, cycloheptyl, adamantyl, cyclooctyl, cis- or trans decalin, bicyclo[2.2.1]hept-2-ene, cyclohex-1-enyl, cyclopent-1-enyl, 1,4-cyclooctadienyl, and the like. A cycloalkyl group is optionally substituted, unless stated otherwise, with one or more groups, selected from aryl (including substituted aryl), heterocyclo (including substituted heterocyclo), carbocyclo (including substituted carbocyclo), halo, hydroxy, protected hydroxy, alkoxy (e.g., $C_1$ to $C_7$) (optionally substituted), poly(oxyalkylene) (e.g. ethoxylated or propoxylated groups), acyl (e.g., $C_1$ to $C_7$), aryloxy (optionally substituted), alkylester (optionally substituted), arylester (optionally substituted), alkanoyl (optionally substituted), aroyl (optionally substituted), carboxy, protected carboxy, cyano, nitro, amino, substituted amino, (monosubstituted)amino, (disubstituted)amino, protected amino, amido, lactam, urea, urethane, sulfonyl, and the like.

The terms "aromatic", "ar", or "aryl" refer to aromatic homocyclic (i.e., hydrocarbon) mono-, bi-, or tricyclic ring-containing groups, for example having 6 to 12 members such as phenyl, naphthyl, and biphenyl. An aryl group is optionally substituted, unless stated otherwise, with one or more groups, selected from alkyl (optionally substituted alkyl), alkenyl (optionally substituted), aryl (optionally substituted), heterocyclo (optionally substituted), halo, hydroxy, alkoxy (optionally substituted), poly(oxyalkylene) (e.g. ethoxylated or propoxylated groups), aryloxy (optionally substituted), alkanoyl (optionally substituted), aroyl, (optionally substituted), alkylester (optionally substituted), arylester (optionally substituted), cyano, nitro, amino, substituted amino, amido, lactam, urea, urethane, sulfonyl, and the like. Optionally, adjacent substituents, together with the atoms to which they are bonded, form a 3- to 7-member ring.

DETAILED DESCRIPTION

Embodiments of the present disclosure provide for ester compositions, solvents, cleaning formulations, curing agents, reactive diluent solvents, controlled acid function release agents, polyol monomers, drilling mud, methods of making each of the above, methods of using each of the above, methods for hardening a friable substrate, and the like.

Embodiments of the present disclosure include methods for making a composition substantially (e.g., greater than about 50 wt %) comprising esters and alcohols (e.g., hydrocarbyl esters, methyl esters, ethyl esters, and the like). In an embodiment, the ester composition can be obtained by a process (or a system) applied to a portion of products from a cyclohexane oxidation process. In an embodiment, the ester or alcohol can include an aliphatic ester, a cycloaliphatic ester, an aromatic ester, an aliphatic alcohol, a cycloaliphatic alcohol, and/or an aromatic alcohol.

Embodiments of the disclosure include a relatively simple process using readily available equipment that may operate at high recovery to make it practical to economically produce an ester composition as well as solvents, cleaning formulations, curing agents, reactive diluent solvents, controlled acid function release agents, and the like.

As starting materials for an embodiment of the process (or from a system), a portion of products from an aqueous extract from a cyclohexane oxidation process (or from a system), hereinafter called "Water Wash", a concentrated aqueous extract from a cyclohexane oxidation process, herein after called "COP Acid", the distillation bottoms from KA refining referred to herein as nonvolatile residue or "NVR", or a combination thereof, can be used. In regard to "a combination thereof", any one or a combination of two (Water Wash and COP acid; Water Wash and NVR; or COP and NVR) or a combination of all three (Water Wash, COP acid, and NVR) can be considered a combination thereof.

In an embodiment, "COP Acid" may be provided by contacting cyclohexane air oxidation products with water in an extraction step and separating the aqueous phase, the extract hereinafter called "Water Wash." In an embodiment, the "Water Wash" is thermally treated to destroy peroxides that may pose difficulties during storage and shipment. The Water Wash may be concentrated by partial removal of water to reduce storage volume and transportation cost.

In an embodiment, COP Acid generally may contain about 10% to 70% by weight water. In an embodiment, COP Acid may contain about 10% to 50% by weight water. In an embodiment, NVR may contain about 10% to 50% by weight water. In an embodiment, Wash Water may contain about 70% to 90% by weight water. In an embodiment, Wash Water may contain about 85% by weight water.

In an embodiment, the composition substantially comprises greater than about 70 wt % esters and alcohols (e.g., hydrocarbyl esters, methyl esters, n-propyl esters, ethyl esters, isopropyl esters, and the like) obtained by a process (or a system) applied to a portion of products (e.g., starting material) of a cyclohexane oxidation. In an embodiment, the starting material is a portion of products from a cyclohexane oxidation product having at least a portion of free acid functional groups as indicated, in an embodiment, by an acid number greater than about 250 mg KOH/g (on an anhydrous basis). In an embodiment, the starting material is: a water extract (Water Wash), a concentrated water extract ("COP Acid"), a non-volatile residue (NVR), or a combination thereof.

In an embodiment, the "Water Wash", "COP Acid", "NVR", or a combination thereof can include mono-functional, poly-functional, and multi-functional products of the cyclohexane oxidation. In an embodiment, the functional group(s) on the product can include: an acid (e.g., a monobasic carboxylic acid and a dibasic carboxylic acid), a peroxide (e.g., a hydroperoxide, a dialkyl peroxide), a ketone (e.g., an aliphatic or cycloaliphatic ketone), an alcohol (e.g., an aliphatic alcohol, a cycloaliphatic alcohol), an ester (e.g., an aliphatic ester, a cycloaliphatic ester), an aldehyde (e.g., an aliphatic aldehyde, aldehyde-acid), a lactone (e.g., an aliphatic lactone), and an alkene (e.g., a keto-alkene, an alkene acid, an alkene alcohol). In an embodiment, the functional group of the product can include: an acid, a peroxide, a ketone, an alcohol, an ester, a lactone, an aldehyde, and a combination of the same or different functional groups (e.g., a hydroxyacid, a di-acid, a keto-acid, an aldehyde-acid, a diol, or an acid-hydroperoxide).

In an embodiment, the mono-acid can include: formic acid, acetic acid, propionic acid, butyric acid, valeric acid, caproic acid, and the like.

In an embodiment, the di-acid can include malonic acid, succinic acid, glutaric acid, adipic acid, fumaric acid, maleic acid, oxalic acid, hex-2-enedioic acid, and the like.

In an embodiment, the peroxide can include cyclohexyl-hydroperoxide, hydroxycaproic hydroperoxide, and the like.

In an embodiment, the ketone can include cyclohexanone, cyclopentanone, and the like.

In an embodiment, the keto-acid can include an alpha-keto acid (e.g., a 2-oxo acid such as pyruvic acid), a beta-keto acid (e.g., a 3-oxo acid such as acetoacetic acid), a gamma-keto acid (e.g., a 4-oxo acid such as levulinic acid), a 5-oxo caproic acid, and the like.

In an embodiment, the alcohol can include cyclohexanol, propanol (e.g., 1-propanol and 2-propanol), butanol (e.g., 1-butanol, 2-butanol, etc.), pentanol (e.g., 1-pentanol, 2-pentanol, etc.), hexanol (e.g., 1-hexanol, 2-hexanol, etc.), and a diol (e.g., 1,2-, 1,3-, and 1,4-cyclohexanediols), a butanediol isomer, a pentanediol isomer, and the like.

In an embodiment, the alcohol functional group(s) may form ester and/or polyester linkages with an acid functional group present in Water Wash, COP Acid, NVR, or a combination thereof. In an embodiment, the hydroxyacid may form ester or polyester linkages with themselves or with other polyfunctional materials present in the mixture. In an embodiment, adipic acid may form an ester linkage (e.g., condensation reaction product) with the alcohol function in hydroxycaproic acid. In an embodiment, hydroxycaproic acid may form an ester linkage (e.g., condensation reaction product) with the alcohol function in another hydroxycaproic acid. In an embodiment, the formed ester can include cyclohexylformate, cyclohexylvalerate, and the like.

In an embodiment, the aldehyde-acid can include 5-formyl valeric acid, 4-formyl butyric acid, and the like.

In an embodiment, the lactone can include gamma-butyrolactone, delta-valerolactone, gamma-valerolactone, epsilon-caprolactone, and the like.

In an embodiment, the alkene can include cyclohexene-1-one, pentenoic acid, cyclohexene-ol, and the like.

In an embodiment, the hydroxyacid can include hydroxycaproic acid, hydroxyvaleric acid, hydroxybutryic acid, hydroxypropionic acid, or hydroxyacetic acid. In an embodiment, the acid functional group is at one end of a linear chain (e.g., a hydrocarbyl chain) and the hydroxy group may be present in various positions along the chain.

In an embodiment, the hydroxycaproic acid can include 2-hydroxycaproic acid, 3-hydroxycaproic acid, 4-hydroxycaproic acid, 5-hydroxycaproic acid, and 6-hydroxycaproic acid. In an embodiment, the hydroxycaproic acid can include 6-hydroxycaproic acid. In an embodiment, the hydroxyvaleric acid can include 2-hydroxyvaleric acid, 3-hydroxyvaleric acid, 4-hydroxyvaleric acid, and 5-hydroxyvaleric acid. In an embodiment, the hydroxyvaleric acid can include 5-hydroxyvaleric acid. In an embodiment, the hydroxybutyric acid can include 2-hydroxybutyric acid, 3-hydroxybutyric acid, and 4-hydroxybutyric acid. In an embodiment, the hydroxybutyric acid can include 4-hydroxybutyric acid. In an embodiment, the hydroxypropionic acid can include 2-hydroxypropionic acid and 3-hydroxypropionic acid. In an embodiment, the hydroxypropionic acid can include 3-hydroxypropionic acid.

In an embodiment, the process for obtaining the composition of esters (e.g., hydroxyl esters, methyl esters, and the like), substantially (greater than 50% by weight, or greater than 60% by weight, or more) includes the steps of: in a first optional step, dehydrating the portion of products; in a second step, converting free acid functional groups of the products to ester groups (e.g., monomeric esters and oligomeric esters); and in a third step, converting oligomeric esters (e.g., by means of transesterification) to monomeric esters. In an embodiment, monomeric esters can be formed in each of the second and third steps. In an embodiment, the second and third steps are combined in a single step. For example, sufficient alcohol is added and temperature is maintained so as to conduct the esterification and transesterification in a single step. As used herein the phrase "oligomeric ester" refers to ester condensation products that can be viewed as being formed by combination of two or more polyfunctional molecules containing hydroxy and/or acid and/or ester functional groups. For example, the polyfunctional molecule adipic acid (or its esters) can be viewed as condensing with the polyfunctional molecule 6-hydroxycaproic acid (or its esters) forming (when methanol is used in the esterification) an oligomeric ester such as that shown below containing one adipic moiety and one oxycaproyl moiety.

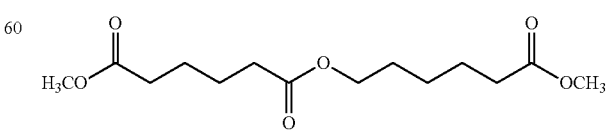

Since the oligomeric ester illustrated above contains terminal ester functionality, it is possible for it to react with one or more additional polyfunctional molecules (e.g. another 6-hydroxycaproic acid or ester) to form a longer oligomer containing one adipic moiety and two oxycaproyl moieties and so on. In this way it is possible to envision oligomeric esters containing 2, 3, or even more moieties derived from polyfunctional acids, esters, and alcohols present in the starting material. Other oligomeric esters can be formed by reaction of carboxylic acids or esters (e.g., adipic acid or its esters, 6-hydroxycaproic acid or its esters, etc.) with diols (e.g., pentanediol, cyclohexanediol, etc.). Oligomeric esters have higher molecular weight than monomeric ester products and are difficult to recover by distillation. Although some small amount of oligomeric ester derived from two polyfunctional molecules ("dimers") may sometimes be present in the ester solvent of the current disclosure, most oligomeric esters have very low volatility and are lost in the distillation residue. Since oligomeric esters may contain adipic and oxycaproyl moieties (as well as other polyfunctional moieties from the starting material), loss with the distillation residue represents a yield loss of ester of the present disclosure. The purpose of the transesterification step is to break down oligomeric esters, at least partially, to monomeric esters that can be recovered as ester solvent of the current disclosure.

In one embodiment, when the process (or system) is carried out using methanol in the esterification and transesterification steps, the composition of methyl esters, so-formed, substantially comprises dimethyl adipate and methyl hydroxycaproate.

In an embodiment, a catalyst is used in the second step. In an embodiment, a catalyst is used in the third step. In an embodiment, the same catalyst is used in the second and third steps. In an embodiment, the catalyst is an esterification catalyst. In an embodiment, the catalyst is a strong Lewis or Brönsted acid (e.g., sulfuric acid, sulfonic acid). In an embodiment the catalyst is methanesulfonic acid, xylenesulfonic acid, or benzene sulfonic acid. In an embodiment, the catalyst is a transition metal catalyst (e.g., titanium- or tin-based).

In an embodiment, the process includes isolating the monomeric ester composition by distillation, for example. In an embodiment, the isolation can be conducted using vapor-liquid separation (e.g., single-stage flash separation, evaporation (short-path, wiped, falling film, atmospheric, sub-atmospheric), multi-stage distillation, multiple instances of these, or combinations of these), liquid-liquid separation by differential solubility, solid-liquid separations (e.g., fractional crystallization), separation by molecular size and shape (e.g., membrane separation), post treatments (e.g., carbon decolorizing, clay treatments, and the like), and combinations of each of these (e.g., extractive distillation, distillation followed by post treatments, and the like).

In an embodiment, the ester composition includes about 40 wt % methyl hydroxycaproate and about 27 wt % dimethyl adipate. In addition, the ester composition can include about 3 wt % dimethyl glutarate, about 0.5 wt % dimethyl succinate, about 4 wt % cyclohexanediols, about 4 wt % methyl 5-hydroxyvalerate, about 2 wt % methyl valerate, about 2 wt % valerolactone, and about 0.7 wt % methyl levulinate. It should be noted that other compounds may be present and, if present, were not identified or quantified. In an embodiment, the ester composition can have an acid number of about 0.07 mg KOH/g, a water content of about 0.04 wt %, and a hydroxyl number of about 257 mg KOH/g. Thus, in an embodiment, about 380 g NVR (water-free basis) gave about 220 g methyl ester product with the analytical characteristics above.

Table 1, below, shows concentration ranges, in weight percent, for ester compositions within the scope of the disclosure. In general, the ester composition ranges in Table 1 can be obtained when it is desirable to maximize the recovery of esters (e.g., methyl esters). Higher or lower concentrations of certain components (e.g., dimethyl adipate, methyl hydroxycaproate, and the like) can be obtained by selective product isolation in product isolation Step 5, as described further hereinafter. Concentration range D is an example of an ester composition from the COP Acid feed. Concentration range E is an example of an ester composition from a NVR feed. In an embodiment, for each concentration range A-E noted in Table 1, the components other than methyl hydroxycaproate and dimethyl adipate can optionally be present. For example, an embodiment of the ester composition includes about 10 to 60 weight % of methyl hydroxycaproate and about 20 to 80 dimethyl adipate. In another example, an embodiment of the ester composition includes about 15 to 50 weight % of methyl hydroxycaproate and about 30 to 70 weight % dimethyl adipate. In any of the embodiments disclosed herein or the embodiments shown in Table 1, the composition may contain less than about 20 wt % oligomeric esters. For example the composition may contain about 0.001 to 20 wt %, about 0.001 to 14 wt %, or about 0.001 to 10 wt % oligomeric esters. It is understood to be within the scope of the invention to select a concentration from any one column of Table 1 in combination with concentrations from any other columns of Table 1 provided that the sum of the concentrations is less than or equal to 100 wt %. Any of the compositions may contain less than about 5 wt % methyl valerate (e.g., about 0.01 to about 5 wt %, about 0.01 to 3 wt %, 0.01 to 1.5 wt %, about 0.01 to 0.1 wt %) and/or less than about 10 wt % valerolactone (e.g., about 0.01 to 10 wt %, about 0.01 to 7 wt %, 0.01 to 4 wt %, 0.01 to 2 wt %).

TABLE 1

| Component | Concentration Range A, wt % | Concentration Range B, wt % | Concentration Range C, wt % | Concentration Range D, wt % | Concentration Range E, wt % |
|---|---|---|---|---|---|
| methyl hydroxycaproate | about 10 to 60 | about 15 to 50 | about 20 to 40 | about 15 to 40 | about 30 to 50 |
| dimethyl adipate | about 20 to 80 | about 30 to 70 | about 35 to 55 | about 30 to 50 | about 20 to 40 |
| dimethyl glutarate | about 1 to 15 | about 2 to 10 | about 3 to 7 | about 4 to 8 | about 1 to 5 |
| dimethyl succinate | about 0.1 to 5 | about 0.25 to 3 | about 0.5 to 2 | about 1 to 2 | about 0.1 to 2 |
| Cyclohexanediols | about 0.1 to 7 | about 0.25 to 5 | about 1 to 3 | about 2 to 4 | about 2 to 6 |
| methyl 5-hydroxyvalerate | about 0.1 to 7 | about 0.25 to 5 | about 1 to 3 | about 0.2 to 2 | about 3 to 5 |
| gamma butyrolactone | about 0.01 to 5 | about 0.01 to 3 | about 0.01 to 2 | about 0.01 to 1 | about 0.01 to 2 |
| methyl levulinate | about 0.01 to 10 | about 0.01 to 7 | about 0.01 to 4 | about 0.01 to 3 | about 0.01 to 4 |

The following paragraphs describe an embodiment of the process. In Step 1, a sufficient amount of water and other low-boiling compounds (e.g., formic acid, acetic acid, etc.) in the starting material (e.g., a portion of products from a cyclohexane oxidation process) are removed to reach a desired esterification temperature and pressure. Where an esterification or a transesterification catalyst is included, the water removed may include water of reaction formed as hydroxyl-functional compounds react with acids present in the mixture to form ester linkages. Some formation of oligomeric esters in this step may not be detrimental to overall yield. This is due to their subsequent cleavage in Step 3. In an embodiment, Step 1 is optional, and the initial step is Step 2. In an embodiment, a step prior to Step 1 can be conducted to remove water and/or other low-boiling compounds, where this step and Step 1 are different.

In Step 2, methanol (or other alcohol such as propanol, ethanol, isopropanol, and the like, in other embodiments (See Examples)) is added and allowed to react with carboxylic acids present in the mixture. The starting material is a portion of products that may include a mixture of carboxylic acids, and may comprise monoacids (e.g., formic, acetic, valeric, etc.), diacids (e.g., mainly C6 adipic but also C5 glutaric and others), hydroxy-acids (e.g., 6-hydroxycaproic, 5-hydroxyvaleric, and others), water, and other organic compounds. In an embodiment, the esterification process conditions may include a temperature of about 50° C. to 250° C., for example about 80° C. to 160° C.; pressure sufficient to maintain the reactants and products in the liquid phase at reaction conditions, for example about 15 kPa to 1500 kPa, or about 50 kPa to 500 kPa. The esterification reaction may be carried out in any suitable reaction apparatus, for example, a continuous stirred tank reactor, a batch reactor, a tubular flow reactor, or a reactive distillation apparatus. It is known that condensation esterification reactions are equilibrium reactions and the extent of esterification may be increased by removing water of reaction. In an embodiment, water of reaction is removed continuously during the esterification reaction. In an embodiment, water is removed in an intermittent fashion such as in a staged process of alternating reaction steps and water removal steps. In an embodiment, water is removed azeotropically, using a suitable azeotropic agent able to form an azeotrope with water. Alcohol (e.g., methanol) addition, residence time, and water removal are controlled depending upon the extent of esterification desired, for example to achieve about 85% to 99.9% conversion of carboxylic acids to the corresponding esters, or to react the reaction mixture substantially (e.g., more than half way) to equilibrium. Depending on reaction conditions, suitable residence times may be less than about 1 hour to 24 hours, for example about 1 to 12 hours.

In an embodiment, water is removed as vapor, as is known to those skilled in the art of esterification chemistry, using methanol as a stripping agent to facilitate removal of water and drive the esterification reaction toward completion. No chlorinated materials or other azeotropic agents are used or required. Removal of water in Step 1 is beneficial in reducing the amount of water-wet methanol from Step 2, which is subsequently distilled to recover methanol value. Esterification is continued until the acid number reaches a desired low value, for example less than about 30 mg KOH/gram. In an embodiment, esterification is continued until the acid number is less than about 10 mg KOH/gram. In an embodiment, added methanol reacts with carboxylic acids in the mixture to form methyl esters during esterification; other hydroxyl-functional compounds present in the mixture also react with carboxylic acids in the mixture to form esters. In an embodiment, these esters may include oligomeric polyesters. Such oligomeric polyesters are subsequently cleaved in Step 3, and their formation is not detrimental to the overall process.

In Step 3, the products of Step 2, comprising monomeric esters (e.g., methyl esters) and oligomeric esters are treated with (e.g., about 0.2 to 3.0 g methanol/g feed on a dry basis, or from about 0.4 to 1.5 g methanol/g feed on a wet basis) methanol to cleave the oligomeric esters to monomeric esters (e.g., methyl esters). This additional methanol is added without allowing any significant amount of material to distill out of the reacting mixture. The key element distinguishing step 3 from step 2 is the presence of enough added methanol in the reacting mixture to break oligomeric esters down to monomeric esters. In an embodiment, sufficient additional methanol is added to achieve recovery of greater than 70% of the theoretically obtainable amounts of dimethyl adipate and methyl hydroxycaproate for the specific starting material (the portion of products). For example, an ester formed by condensation of hydroxycaproic acid with adipic acid is cleaved to methyl hydroxycaproate and dimethyl adipate.

Step 3 can be conducted in the same reactor as Step 2, or in a different reactor, such as a tubular reactor known in the art. Step 3 can also be conducted at elevated temperature, a condition known for increasing reaction rate. It should be understood that when reaction temperature is greater than the atmospheric bubble-point of the reacting mixture, then reaction pressure will be greater than atmospheric pressure.

In an embodiment, Step 3 is conducted at a temperature from about 50° C. to 250° C. In an embodiment, Step 3 is conducted at a temperature from about 80° C. to 150° C. In an embodiment, Step 3 is conducted at a temperature of about 65° C. to 75° C. In an embodiment, Steps 2 and 3 are combined, and enough methanol is added in the combined step to achieve the goals of Steps 2 and 3.

In Step 4, the product of Step 3 is neutralized by addition of a calculated amount of suitable base (e.g., metal alkoxides, metal alkyls, or metal hydroxides). In an embodiment, the base is sodium methylate, which may be added as solid or in methanol solution. In an embodiment, the base is sodium hydroxide, which may be added as solid or as 50 wt % aqueous sodium hydroxide. The calculated amount of suitable base is determined by first analyzing the product of Step 3 for acid number, then calculating the stoichiometric amount of base to neutralize the acid based on that acid number and the total weight of material. Water is avoided to minimize saponification of esters, but the small amount of water added along with 50 wt % aqueous sodium hydroxide is acceptable. Neutralization is generally practiced because any residual catalyst may lead to re-formation of oligomeric polyesters as methanol is removed. In an embodiment, the acid number after neutralization is in the range of 0 to 1 mg KOH/g. In an embodiment, the acid number after neutralization is in the range of 0 to 0.25 mg KOH/g. In an embodiment, Step 4 may or may not be included.

In Step 5, the neutralized product of Step 4 is isolated and refined by distillation. Distillation may be batch or continuous performed in the known manner. In an embodiment, distillation yields four fractions or cuts: (1) a light fraction, primarily methanol, which is low in water content and can be recycled directly to esterification; (2) an intermediate or transition cut; (3) an ester product fraction; and (4) bottoms, or high-boiling distillation residue. The relative sizes chosen for fractions (2), (3), and (4) depend on the properties (e.g., water content, hydroxyl number, acid number, methanol content, flash point, and/or vapor pressure) desired for ester product fraction (3). As such, ester compositions within the scope of this disclosure can include ester compositions outside the ranges disclosed in Table 1. For example, ester product fractions that are higher in diester concentration and lower in hydroxyester concentration can be obtained by isolating as product a lower-boiling range of distillation cuts.

As illustrated in Table 3 of Example 2, cuts 3 through 6 can be isolated to obtain a product composition (ester composition) that contains greater than about 90 wt % dimethyl adipate and less than about 2 wt % methyl hydroxycaproate. In an embodiment, the product composition contains about 50 to 100 wt % diesters and about 0.05 to 2.0 wt % hydroxyesters. In an embodiment, the product composition contains about 50 to 100 wt % dimethyl adipate and about 0.05 to 2.0 wt % methyl hydroxycaproate. Ester product fractions that are lower in diester concentration and higher in hydroxyester concentration can be obtained by isolating as product a higher-boiling range of cuts. As illustrated in Table 3 of Example 2, cuts 8 through 10 can be isolated to obtain a product that has less than about 2 wt % dimethyl adipate and greater than about 95 wt % methyl hydroxycaproate. In an embodiment, the product composition contains about 0 to 2 wt % diesters and about 50 to 100 wt % hydroxyesters. In an embodiment, the product composition contains about 0 to 2 wt % dimethyl adipate and about 50 to 100 wt % methyl hydroxycaproate.

The isolated product obtained is a colorless, high-boiling, liquid mixture of monoesters, diesters, hydroxy-esters, and other components, where the product has a hydroxyl number of about 100 to 400 mg KOH/gram. In one embodiment, the product has a hydroxyl number of about 100 to 350 mg KOH/gram. In one embodiment, the product has a hydroxyl number of about 100 to 250 mg KOH/gram.

When the process is carried out using methanol as the esterification and transesterification alcohol, the main components are generally dimethyl adipate and methyl hydroxycaproate, but other components such as monoesters (e.g., methyl valerate, methyl levulinate), diesters (e.g., dimethyl glutarate, dimethyl succinate), hydroxyesters (e.g., methyl 5-hydroxyvalerate, methyl hydroxypropanoate), alcohols (methanol, cyclohexanol, pentanediol, cyclohexanediol), lactones (e.g., valerolactone, gamma butyrolactone), and the like may also be present. Generally, the multitude of components does not interfere with the many uses contemplated for this composition as a solvent. It should be noted that other esterification and transesterification alcohols (e.g., ethanol, propanol, isopropanol, and the like) could be used.

In an embodiment where solvency and physical properties are more important, a precise chemical composition is not generally required. Embodiments of this mixture have very desirable properties such as high flash point (e.g., greater than about 60° C. or greater than about 93° C.) and the ability to dissolve or plasticize many resins (e.g., phenolic, polyester, polyurethane resins, epoxy, a phenoxy, a styrenic, a copolymer of a styrenic resin with maleic anhydride and/or an acrylonitrile, an acrylic, a methacrylic, a polyvinylbutyral, a vinylidene halide including a vinylidene fluoride, a vinylic resin including a vinyl chloride and a vinyl acetate), such as those resins used in coatings, adhesives, sealants, elastomers, composites, castings, moldings, and the like.

In an embodiment, the hydroxyl content may provide a useful complement to commercially-available methyl esters of dicarboxylic acids, such as dimethyl succinate, dimethyl glutarate, and dimethyl adipate (e.g., dibasic ester, DBE™ dibasic esters, available from INVISTA S.à r.l.). In an embodiment, the product of isolation Step 5 may be further refined by distillation to obtain cuts with different hydroxyl number (e.g., 0 to 50 mg KOH/g or 350 to 400 mg KOH/g), or may be blended with other solvents (e.g., propylene carbonate, fatty acid methyl esters, dipropylene glycol methyl ether acetate, isophrone, dipropylene glycol, dimethyl adipate, dimethyl glutarate, dimethyl succinate, DBE™ dibasic esters) to achieve properties (e.g., viscosity, solubility parameters) depending on the desired application.

Embodiments of the ester composition (e.g., methyl ester composition) of the present disclosure may be useful as an ester solvent for resins and adhesives found in many household and industrial applications. For example, solvents may be used to remove excess adhesive from surfaces or skin. Industrially, solvents may be used to clean or flush equipment used in manufacturing, handling, or applying coatings, adhesives, resins and other similar materials. Solvents may be used as plasticizers or resin processing aids. Solvents may be ingredients in industrial adhesives or binder systems such as those used in manufacture of foundry molds and cores as described, for example, in U.S. Pat. No. 4,273,179, which is incorporated herein by reference. Solvents of the present disclosure are excellent solvents for many adhesives and resins. Their ability to dissolve resins without gelling facilitates handling the resulting mixtures of solvent and resin as well as reuse, recovery and recycle of solvent. For example, when a solvent is used as line flush in resin processing equipment, the used solvent may still have capability to dissolve more resin and may be set aside for later reuse in another flush operation; if the used solvent gels, reuse may be impossible.

Frequently, low volatility and high flash point are desirable from an environmental, health, and safety viewpoint to minimize risk to people and the environment. Esters of the current disclosure have very low volatility compared to common solvents such as acetone or methylene chloride, and often have flash points above 93° C., which allows them to be classified as non-combustible in the United States.

The combination of low volatility and hydroxyl content make the ester solvent of the present disclosure particularly useful as a reactive diluent in certain applications such as foundry, where these properties can reduce emissions of volatile organic compounds (VOCs) during the manufacturing process. For example, the ester solvent can be used as diluent and viscosity control solvent for a phenolic resin used in a two-part polyurethane binder system. When the phenolic resin solution is subsequently combined with the isocyanate part of the phenolic binder system and allowed to cure, hydroxyl-containing components present in the ester solvent react and become incorporated into the cured polyurethane binder, preventing release of these components as VOCs.

The ester composition of the present disclosure is also useful as a curing agent for sodium silicate binder systems, such as those used in soil stabilization, chemical grouting, or as binders for various aggregates. In these applications, the ester components of the ester solvent react with sodium silicate solution, neutralizing the sodium silicate and leading to precipitation of silicates and silica that serve as the binder.

In an embodiment, the ester composition (or solvent) of the present disclosure can be used directly or can be mixed with co-solvents or surfactants to alter solvent properties (e.g., viscosity) or performance. For example, co-solvents can be mixed with the ester solvent of the present disclosure to alter the viscosity of a dissolved phenolic resin. Any solvent chemically compatible with the ester solvent of the present disclosure can be considered as a possible co-solvent. Table 2 below illustrates that through selection of co-solvent and ester composition, viscosity can be modified over a wide range, from about 0.5 to 1.6 that of the comparison case of no co-solvent.

TABLE 2

| Co-solvent (weight %) (the remainder of the weight % is the ester solvent) | Viscosity of 50% phenolic resin solution, cSt at 22 C. |
|---|---|
| None | 182 |
| 10% ethyl 3-ethoxypropionate | 157 |

TABLE 2-continued

| Co-solvent (weight %) (the remainder of the weight % is the ester solvent) | Viscosity of 50% phenolic resin solution, cSt at 22 C. |
|---|---|
| 20% ethyl 3-ethoxypropionate | 138 |
| 30% ethyl 3-ethoxypropionate | 120 |
| 40% ethyl 3-ethoxypropionate | 94 |
| 50% ethyl 3-ethoxypropionate | 85 |
| (replicate measurement) | |
| 50% ethyl 3-ethoxypropionate | 84 |
| 20% Aromatic Naphtha | 162 |
| (available as Aromatic 150) | |
| 50% Aromatic Naphtha | 114 |
| (available as Aromatic 150) | |
| 66% Aromatic Naphtha | 111 |
| (available as Aromatic 150) | |
| 20% propylene carbonate | 168 |
| 50% propylene carbonate | 143 |
| 25% dipropylene glycol methyl ether acetate | 175 |
| 50% dipropylene glycol methyl ether acetate | 204 |
| 30% Isophorone | 213 |
| 50% Isophorone | 287 |
| 25% soy methyl ester | 183 |
| 50% 2-ethylhexyl acetate | 123 |
| 50% ethylene glycol diacetate | 148 |
| 25% propylene carbonate/25% Aromatic 150 | 127 |
| 25% dipropylene glycol methyl ether acetate/25% Aromatic 150 | 161 |

Depending on the choice of solvent, viscosity may be increased or decreased, although in some cases lower viscosity is desirable. In an embodiment, a mixture of ethyl 3-ethyoxy propionate and the ester solvent of the present disclosure can be used as diluent and viscosity control solvent for a phenolic resin used in a two-part polyurethane binder system. In an embodiment, about 25 to 75 wt % of ethyl 3-ethyoxy propionate combined with about 75 to 25 wt % of the ester solvent of the present disclosure is used as diluent and viscosity control solvent for a phenolic resin used in a two-part polyurethane binder system. In an embodiment, a 50/50 wt % mixture of ethyl 3-ethyoxy propionate and the ester solvent of the present disclosure can be used as diluent and viscosity control solvent for a phenolic resin used in a two-part polyurethane binder system.

Embodiments of the ester composition (e.g., methyl ester composition) of the present disclosure may be useful as starting materials for preparation of hydroxyl-terminated polyester polyols, which in turn are useful intermediates for manufacture of polyurethanes. Polyester polyols of 500-3000 molecular weight are of particular importance because a broad range of high-performance polyurethane products can be prepared from them. These products include foams and microcellular elastomers, coatings, adhesives, synthetic leathers, spandex filament, and elastomers formed by casting, injection molding, transfer molding, and extrusion.

Such polyester polyols can be prepared by various methods known in the art for forming ester linkages. Such methods include (1) Condensation reaction of a diacid with a diol splitting out water of reaction; (2) Condensation reaction of a diester with a diol splitting out alcohol of reaction; (3) Ring-opening oligomerization reaction of lactones such as caprolactone with a diol starter; (4) Condensation reaction of a hydroxyacid, such as 6-hydroxycaproic acid, with a diol, splitting out water of reaction; and (5) Condensation reaction of a hydroxyester, such as methyl 6-hydroxycaproate, with a diol, splitting out alcohol of reaction. Other variations are possible, such as substitution of acid chlorides for acids. Inclusion of some higher-functionality reactants such as triols (e.g. glycerol, trimethylolpropane, etc.) can be used to introduce branching into the polyol, if desired. Removal of water or alcohol from condensation reactions drives the polyol-forming reaction to completion. Various methods are known in the art to accomplish water or alcohol removal including use of high reaction temperatures (e.g., 180-250° C.), nitrogen sparging, or vacuum (e.g., 50 mm Hg absolute or lower).

A catalyst may be used to increase rate of reaction. Commonly used catalysts include titanium compounds such as tetra-alkyl titanates (e.g. tetraisopropyl titanate, tetrabutyl titanate, etc), tin compounds such as dialkyl tin dicarboxylates (dibutyl tin diacetate, dibutyl tin dilaurate, etc), dibutyl tin oxide, or stannous halides (chloride, bromide, iodide), zinc borate, soluble manganese compounds such as manganese acetate, and others.

Commonly used diols include ethylene glycol, diethylene glycol, triethylene and higher polyethylene glycols, propylene glycol and it's higher homologs, 1,3-propanediol, tetra-, penta-, and hexa-methylene glycols, 1,2-, 2,3-, and 1,3-butanediols, neopentyl glycol, 2-ethyl-2-methyl-1,3-propanediol, cyclohexanediols, cyclohexanedimethanols, bis(hydroxymethyl) benzene and others.

Commonly used diacids include succinic, glutaric, adipic, phthalic, terephthalic, isophthalic, pimelic, sebacic, azelaic, etc. Lower alkyl diesters of these same acids may be used where the lower alkyl is methyl, ethyl, propyl, isopropyl, butyl, etc. For example, dimethyl adipate reacts with 1,4-butanediol, releasing methanol, to form the polyester polyol poly(butanediol adipate). A slight molar excess of 1,4-butanediol is used to ensure that the polyol is hydroxyl terminated. The relative amounts of 1,4-butanediol and adipate, together with processing conditions, determine the average molecular weight of the polyester polyol. U.S. Pat. No. 4,525,574 discloses polyols from DBA (mixture of dibasic acid including adipic acid, glutaric acid, and succinic acid) or DBE (mixture of dimethyl adipate, glutarate, and succinate) and use of those polyols to make polyurethanes (elastomer and foam). Diester components of the present disclosure (e.g., dimethyl adipate, dimethyl glutarate) react according to (2), forming ester linkages while splitting out alcohol (e.g., methanol) of reaction.

6-hydroxycaproate ester, in the esters of the present disclosure, reacts according to (5), forming ester linkages while splitting out alcohol of reaction.

Properties of the polyester polyol have a major impact on processing into polyurethane and on the final properties of the polyurethane. Liquid, low-viscosity polyols are easier to process than solids that must be heated to melt. This is especially important in the preparation of "one-shot" polyurethane elastomers, for example, where it is highly desirable for reasons of controlling reactivity to mix the polyurethane reactants at room temperature. Adipate polyols having a molecular weight of about 2000, typically made from condensation polymerization of adipic acid with ethylene glycol or 1,4-butanediol are generally solid at room temperature. Ethylene glycol-adipate polyols provide polyurethanes with excellent elastic recovery, but relatively poor hydrolytic stability. Butanediol-adipate polyols provide polyurethanes with somewhat improved hydrolytic stability, but elastic recovery is poor. Adipate polyols made using ether-glycols (e.g. diethylene glycol) are liquid at room temperature, but polyurethanes derived from them have relatively low tensile strength and poor hydrolytic stability. Caprolactone-based polyols with molecular weight of about 2000 are known to provide polyurethanes with high strength and excellent hydrolysis resistance, but such polyols are generally solid at room temperature and their narrow molecular weight distribution tends to give more crystalline soft segments, which can reduce rebound, elastic recovery, flex-fatigue performance, and transparency. Caprolactone-based polyols also tend to be more expensive than adipate polyols. Consequently there remains a need for inexpensive, liquid polyols that impart excellent elastic recovery and hydrolytic stability to polyurethanes made therefrom.

There continues to be a need for low cost, high performance polyols. Specifically, it is desirable that those polyols be liquid at ambient temperature to facilitate use where ingredients are pre-mixed at room temperature. It is further desirable, from the viewpoint of responsible use of resources, that such polyols comprise some recycled content. Surprisingly, it has been found that the ester solvent of the present disclosure provides for novel liquid polyols derived from a portion of products from a cyclohexane oxidation process. The resulting polyols have low color and are typically liquid at 20° C. Viscosity of polyols made from ester solvent of the present disclosure is often lower than viscosity of comparative polyols made using adipic acid or DBE™ Dibasic Ester.

EXAMPLES

Test and Analytical Methods

It is convenient, as one skilled in the art would know, to characterize samples taken during reactions, or in the case of final reaction products by chromatographic methods, e.g., GC, GC-MS, HPLC, spectrophotometric methods such as color analysis, and physical and chemical tests, e.g., hydroxyl number, acid number, water content, flash point, and other tests.

All gas chromatographic (GC) analysis may be performed using an AGILENT TECHNOLOGIES 6890 equipped with AGILENT DB-5, HP-FFAP, or DB-1701 columns, He carrier gas, and flame ionization detectors.

Gas chromatography mass spectrometry (GC-MS) analysis may be performed on an AGILENT TECHNOLOGIES 6890 with a Model 5973-MSD (mass-selective detector) equipped with an Agilent DB-5 or HP-FFAP column using He carrier gas.

HPLC analysis may be performed using an AGILENT 1100 series HPLC system (solvent degasser, quat pump, autosampler, heated column compartment, and diode array UV-VIS detector) fitted with Zorbax SB-Aq C18 column.

Color, hydroxyl number, acid number, water content, and flash point are measured using ASTM methods D 1209, D 1957, D 4662, D 1364, and D 3278 respectively, or by other suitable methods known in the art.

Molecular weight of a polyol can be estimated by measuring hydroxyl number. Hydroxyl number is expressed in units of mg KOH/g. For a diol (two hydroxyl groups per polyol), average molecular weight=112200/measured hydroxyl number. For example, a measured hydroxyl number of 56.1 corresponds to average molecular weight of 2000.

The following internal standard gas chromatography method is used to estimate the amount of dimethyl adipate and methyl hydroxycaproate potentially recoverable from a starting material (e.g., portion of a product of a cyclohexane oxidation process), also referred to herein as the "theoretically obtainable" amount of dimethyl adipate and methyl hydroxycaproate. The method is first calibrated using authentic caprolactone, which forms methyl hydroxycaproate under conditions of the analytical method, and with authentic adipic acid, which forms dimethyl adipate under conditions of the analytical method. In all cases, suberic acid is added as internal standard. A small round bottom flask is fitted with magnetic stirrer, heating mantle, and efficient condenser. The flask is charged with: a) an aliquot of starting material containing about 0.3-0.5 g total caprolactone and adipic acid (typically about 1 g), b) 0.125 g suberic acid as internal standard, and c) 10 mL of 10% sulfuric acid in methanol. The mixture is brought to reflux and refluxed for 30 minutes. The mixture is cooled, and then transferred to a separatory funnel containing 50 mL deionized water. The reaction flask is rinsed with 20 mL dichloromethane, which is added to the separatory funnel and water. The separatory funnel is shaken vigorously, and then allowed to stand so that the phases can separate. The lower phase is drained to a receiver. The aqueous phase remaining in the separatory funnel is extracted twice more with 20 mL portions of dichloromethane. Each time the lower phase is drained to a receiver and combined with the other dichloromethane extract. The combined dichlormethane extract is analyzed by gas chromatography on a DB-5 or other suitable GC column. The GC area results are converted to weight fraction by the usual internal standard calculation.

Pressures reported herein refer to pounds per square inch gauge (psig) which include the pressure of one atmosphere (14.7 pounds per square inch). One atmosphere is equivalent to 14.7 pounds per square inch absolute or 0 pounds per square inch gauge. Vacuum (subatmospheric pressure) is expressed in mm Hg absolute pressure, which is sometimes abbreviated herein as mm Hg.

Synthetic and Analytical Examples

Xylenesulfonic acid is obtained from Alfa Aesar. INVISTA DBE™ dibasic ester is a mixture of dimethyl succinate, dimethyl glutarate, and dimethyl adipate commercially available from INVISTA S.à r.l. In the following examples, DMA denotes dimethyl adipate and MHC denotes methyl 6-hydroxycaproate. In the following examples, wt % is used as the abbreviation for composition percent by weight.

Example 1

Ester Solvent from COP Acid

A 2 L round-bottom flask is charged with 715 g COP Acid (42 wt % water, containing about 19.9 wt % 6-hydroxycaproic acid and about 18.5 wt % adipic acid potential) and 2.0 g xylenesulfonic acid catalyst. The flask was fitted with a magnetic stirrer, electric heating mantle, and 8-inch Vigreux column. At the top of the Vigreux column was attached a condenser and distillate receiver.

Step 1: Dehydration

The mixture is dehydrated by heating while reducing pressure, taking water and low boilers overhead until the pot reaches 120° C. and overhead pressure is 65 mm Hg absolute, yielding 320 g of overheads.

Step 2: Esterification

Methanol is fed through a dip-tube below the surface of the reaction mixture at a rate of 7-8 cc/minute, while maintaining reaction conditions at 135-137° C. and atmospheric pressure. Addition of the methanol is continued until acid number of the reaction mixture decreases to 2.6 mg KOH/g. A total of 611 g methanol is fed and 572 g wet methanol was collected overhead.

Step 3: Transesterification

To the product from Step 2, still in the original 2 L round-bottom flask, is added an additional 2 g xylenesulfonic acid and 990 g methanol. This mixture is held under total reflux (i.e., without withdrawal of any overhead condensate) at atmospheric pressure, with a pot temperature of about 64-65°

C., until LC analysis shows that the composition of the mixture is stabilized. In particular, the amount of methyl hydroxycaproate increases from about 3.5 wt % to 12 wt % and the amount of dimethyl adipate increases from about 5% to 12 wt %. This dramatic increase in concentration of MHC and DMA may result from oligomeric polyesters transesterifying with methanol, producing monomeric DMA and MHC during this transesterification step.

Step 4: Neutralization

At the end of Step 3, the reaction mixture weighs 1393 g and acid number is 1.13 mg KOH/g. Still in the original reaction apparatus, the reaction mixture is neutralized by addition of enough sodium methylate (6.05 g of 25 wt % sodium methylate in methanol) to just neutralize the measured acidity. After addition of sodium methylate, acid number is re-measured and is 0.05 mg KOH/g.

Step 5: Distillation of Product

Still in the original reaction apparatus, the neutralized product of Step 4 is distilled rapidly at atmospheric pressure to remove methanol and any low boilers. Pot temperature is initially about 65° C. but rises gradually as methanol is removed. The methanol removal stage is stopped when pot temperature reaches 123° C., at which time a total of 921 g of methanol and low boilers is collected as overheads. A 1 L round bottom flask is charged with 472 g of bottoms left from methanol removal and distillation is continued using the same 8-inch Vigreux column, condenser and distillate receiver as before. Pressure is reduced and pot temperature is increased while collecting a transition cut overhead. A total of 13 g of transition cut is collected until pot temperature reaches 116° C. and top pressure is 70 mm Hg absolute, at which time the product cut was begun. A total of 333 g product is collected overhead until pot temperature reaches 140° C. and overhead pressure is reduced to 0.3 mm Hg absolute. The distillation heel weighs 117 g and about 7 g of low boilers are recovered from the vacuum system cold trap.

GC analysis of the transition cut indicates it to contain about 98 wt % methanol.

GC analysis of the product cut shows about 40 wt % methyl hydroxycaproate, about 36 wt % dimethyl adipate, about 4.5 wt % dimethyl glutarate, about 1 wt % dimethyl succinate, about 3.5 wt % methyl 5-oxo caproate, about 2 wt % valerolactone, about 0.7 wt % methyl levulinate, and about 0.5 wt % gamma-butyrolactone. Many other compounds may also be present which are not completely identified or quantified. The acid number is about 0.1 mg KOH/g, the water content is about 0.02 wt %, and the hydroxy number is about 211 mg KOH/g for the product. Thus, about 415 g COP Acid (water-free basis) gives about 333 g methyl ester product with the analytical characteristics above. The weight of recovered methyl ester product is about 80 wt % based on the water-free weight of COP Acid used.

Example 2

Fractionation of Methyl Ester Product from Example 1

Example 1 is repeated on the same scale, yielding an additional 337 g methyl ester product. The methyl ester products from these two replicate preparations are combined to produce a composite methyl ester product. The composite methyl ester product contained about 35 wt % methyl hydroxycaproate, about 40 wt % dimethyl adipate, about 4.4 wt % dimethyl glutarate, about 1.1 wt % dimethyl succinate, and about 2 wt % valerolactone, along with many other components that are not completely identified or quantified.

A 1 liter round bottom distillation flask is charged with 609 g composite methyl ester product and attached to the bottom of a 30-plate 1-inch Oldershaw column. The top of the column is fitted with a condenser and reflux splitter to allow control of reflux ratio. The composite methyl ester charge is distilled, beginning at 139° C. pot temperature/8 mm Hg absolute top pressure and ending at 169° C. pot temperature/5 mm Hg absolute top pressure. Ten overhead fractions are taken at a reflux ratio of about 2 reflux to 1 takeoff. Each overhead fraction weighs about 50 g. Analytical data are summarized below in Table 3. GC methods where possible were calibrated using authentic material. In cases where authentic materials were not available, GC area % was used to report composition.

TABLE 3

| | Weight, grams | DMA, GC Area % | MHC, GC Area % | Water, weight % | Hydroxyl number, mg KOH/g | Acid number, mg KOH/g |
|---|---|---|---|---|---|---|
| Composite methyl ester product from Example 1 | 609.0 | 39.61 | 35.45 | 0.02 | 203 | 0.08 |
| Cut 1 | 56.8 | 0.86 | 0.02 | 0.02 | 144 | 0.08 |
| Cut 2 | 52.0 | 46.88 | 0.12 | 0.02 | 89 | 0.02 |
| Cut 3 | 52.0 | 88.42 | 0.44 | 0.02 | 53 | 0.02 |
| Cut 4 | 50.0 | 94.05 | 0.59 | 0.02 | 31 | 0.00 |
| Cut 5 | 43.4 | 95.77 | 0.90 | 0.02 | 21 | 0.01 |
| Cut 6 | 53.4 | 95.74 | 1.97 | 0.02 | 18 | 0.01 |
| Cut 7 | 51.9 | 54.57 | 42.16 | 0.02 | 101 | 0.00 |
| Cut 8 | 54.8 | 1.32 | 94.55 | 0.02 | 369 | 0.01 |
| Cut 9 | 57.4 | 0.04 | 97.52 | 0.02 | 381 | 0.00 |
| Cut 10 | 39.0 | 0.00 | 96.69 | 0.02 | 382 | 0.00 |

Example 3

Ester Solvent from NVR

A 2 L round-bottom flask is charged with 500 g NVR (24 wt % water, acid number 248 mg KOH/g, containing about 19.2 wt % 6-hydroxycaproic acid and about 10.7 wt % adipic acid potential) and 2.0 g 98 wt % sulfuric acid. The flask is fitted with a magnetic stirrer, electric heating mantle, and 8-inch Vigreux column. At the top of the Vigreux column is attached a condenser and distillate receiver.

Step 1: Dehydration

The mixture is dehydrated by heating at atmospheric pressure, taking water and low boilers overhead until the pot reaches 120° C., yielding 127.4 g of overheads.

Step 2: Esterification

Methanol is fed through a dip-tube below the surface of the reaction mixture at a rate of 7 cc/minute, while maintaining reaction conditions at 130-134° C. and atmospheric pressure. The addition of the methanol is continued until acid number of the reaction mixture decreases to 3.1 mg KOH/g. A total of 465 g methanol is fed and 500.2 g wet methanol is collected overhead.

Step 3: Transesterification

To the product from Step 2, still in the original 2 L round-bottom flask, is added an additional 2 g 98 wt % sulfuric acid and 1132 g methanol. This mixture is held under total reflux (i.e., without withdrawal of any overhead condensate) at atmospheric pressure, with a pot temperature of about 64° C., until LC analysis shows that the composition of the mixture has stabilized. In particular, the amount of methyl hydroxycaproate increases from about 5.7 wt % to 9 wt % and the amount of dimethyl adipate increases from about 1.5 wt % to 4.5 wt %. This dramatic increase in concentration of MHC and DMA may result from oligomeric polyesters transesterifying with methanol, producing monomeric DMA and MHC during this transesterification step.

Step 4: Neutralization

At the end of Step 3, the reaction mixture weighs 1454 g and acid number is 1.79 mg KOH/g. Still in the original reaction apparatus, the reaction mixture is neutralized by addition of enough sodium methylate (10.04 g of 25 wt % sodium methylate in methanol) to just neutralize the measured acidity. After addition of sodium methylate, acid number is re-measured and found to be essentially zero.

Step 5: Distillation of Product

Still in the original reaction apparatus, the neutralized product of Step 4 is distilled rapidly at atmospheric pressure to remove methanol and any low boilers. Pot temperature remains at 65-70° C. for most of the methanol removal step but rises when most of the methanol has been removed. The methanol removal stage is stopped when pot temperature reaches 120° C., at which time a total of 1102 g of methanol and low boilers are collected as overheads. A 1 L round bottom flask is charged with 356 g of bottoms left from methanol removal and distillation is continued using the same 8-inch Vigreux column, condenser and distillate receiver as before. Pressure is reduced and pot temperature is increased while collecting a transition cut overhead. A total of 12 g of transition cut is collected until pot temperature reaches 126° C. and top pressure is 90 mm Hg absolute, at which time the product cut is begun. A total of 220 g product was collected overhead until pot temperature reached 141° C. and overhead pressure is reduced to 0.7 mm Hg absolute. The distillation heel weighs 117 g and about 7 g of low boilers are recovered from the vacuum system cold trap.

GC analysis of the transition cut indicates it to contain >80 wt % methanol.

GC analysis of the product cut shows about 40 wt % methyl hydroxycaproate, about 27 wt % dimethyl adipate, about 3 wt % dimethyl glutarate, about 0.5 wt % dimethyl succinate, about 4 wt % cyclohexanediols, about 4 wt % methyl 5-hydroxyvalerate, about 2 wt % methyl valerate, about 2 wt % valerolactone, and about 0.7 wt % methyl levulinate. Many other compounds are also present which were not identified or quantified. The acid number is about 0.07 mg KOH/g, the water content is about 0.04 wt %, and the hydroxy number is about 257 mg KOH/g. Thus, about 380 g NVR (water-free basis) gives about 220 g methyl ester product with the analytical characteristics above.

Comparative Example 1

Attempted Preparation of Ester Solvent from NVR Omitting Transesterification and Neutralization Steps A mixture of 243.5 g NVR, 60 g methanol, and 1.22 g xylenesulfonic acid is charged to a 500 mL round bottom flask fitted with magnetic stirrer, Vigreux column, condenser, and distillate receiver. The mixture is heated until it reaches 105° C., during which time 110.2 g methanol and water are condensed overhead. At that time, subsurface methanol addition is started through a ⅛-inch (3 mm) Teflon tube, using an ISCO pump to control the addition at a rate of 3.1 mL/min. Methanol addition is continued while taking water and methanol overhead, maintaining reaction temperature of about 80-108° C. The reacting mixture is sampled periodically and analyzed to determine the acid number. Over a time frame of about 3 hours, the acid number dropped to 7.1 mg KOH/g and about 412 g is condensed overhead. The transesterification step of the current process is omitted, and the catalyst is not neutralized. The pressure is reduced to 50 mm Hg absolute and the pot temperature is increased to 148° C., during which time a small transition cut (15.7 g) is collected overhead. The temperature is increased further, to 192° C., while the pressure is reduced to 18 mm Hg absolute, but no additional material is distilled overhead. No ester product is recovered in this example.

Comparative Example 2

Attempted Preparation of Ester Solvent from COP Acid Omitting Transesterification and Neutralization Steps A mixture of 250 g COP Acid (about 40 wt % water) and 1.25 g xylenesulfonic acid is charged to a 500 mL round bottom flask fitted with magnetic stirbar, Vigreux column, overhead condenser, and distillate receiver. The mixture is heated until the pot temperature reaches 111° C., during which time 81.3 g material is collected overhead. Methanol is fed through a ⅛-inch (3 mm) Teflon tube, beneath the surface of the reaction mixture, using an ISCO pump to control the addition rate at 3.0 mL/min. The reaction mixture is sampled periodically and analyzed to determine the acid number. After 2.2 hours, the acid number drops to 3 mg KOH/g. During this time, the reaction temperature rises from 111° C. to 131° C., and an additional 326.3 g material is collected overhead. The transesterification step of the current process is omitted, and the catalyst is not neutralized. The Vigreux column is replaced with a 10-plate Oldershaw column. The pressure is reduced to 18 mm Hg absolute while the temperature is increased to 173° C., yielding a small (1.4 g) transition cut overhead. The pressure is reduced further, to <1 mm Hg absolute, while the temperature is increased to 213° C., during which time only about 20 g material is collected overhead. This overhead material comprised about 45 wt % dimethyl adipate, about 12 wt % dimethyl glutarate, about 11 wt % dimethyl succinate, about 7 wt % caprolactone, about 7 wt % methyl 5-oxocaproate, about 3.3 wt % methyl levulinate, and other constituents. The recovered product in this comparative example represents only about 13% of the anhydrous weight of COP Acid charged, which is very poor recovery compared to about 80 wt % recovery in Example 1.

Comparative Example 3

Attempted Preparation of Ester Solvent from COP Acid with Extra Methanol Fed Continuously (Omitting Transesterification Step of the Present Disclosure)

A mixture of 400 g COP Acid (about 40 wt % water) and 1.10 g xylenesulfonic acid is charged to a 1000 mL round bottom flask fitted with magnetic stirbar, packed distillation column with about 8 theoretical stages, overhead condenser, and distillate receiver. The mixture is heated and pressure reduced until the pot conditions reach 130° C. and 60 mm Hg absolute, during which time 156.3 g material is collected overhead. The reaction mixture is returned to atmospheric pressure and methanol is fed through a ⅛-inch (3 mm) Teflon tube, beneath the surface of the reaction mixture, using an ISCO pump to control the addition rate at 2.0 mL/min. The reaction mixture is sampled periodically and analyzed to determine the acid number. After 5 hours, the acid number drops to 8.3 mg KOH/g. During this time, the reaction temperature is maintained in the range 120° C. to 133° C., and an additional 444.4 g material is collected overhead. In this comparative example, additional methanol is fed, equivalent to the amount that would be used in a transesterification step of the present disclosure, except rather than adding the methanol all at once and conducting the transesterification step according to the present disclosure, the methanol is fed continuously while allowing material to be distilled and collected overhead. This comparative example shows that it is not only the use of additional methanol after esterification has been completed, but rather the way in which the additional methanol is used that leads to a significant improvement in product yield. The methanol feed rate is reduced to 0.87 mL/min while reaction temperature is maintained in the range 126-132° C., until an additional 472 mL (373 g, 1.55×weight of dehydrated COP Acid feed) of methanol has been added. During this addition period, an additional 371 g material is collected overhead. The reaction mixture is cooled and catalyst is neutralized by addition of 9.95 g of 50 wt % aqueous sodium hydroxide. Acid number after neutralization is 0.39 mg KOH/g. The pressure is reduced to 35 mm Hg absolute while the temperature is increased to 167° C., yielding a small (9.9 g) transition cut overhead. Pressure is maintained at 35-37 mm Hg absolute while the temperature is increased to 228° C., during which time only about 47 g material is collected overhead. This overhead material comprised only about 6 wt % methyl 6-hydroxycaproate along with 67 wt % dimethyl adipate, about 7 wt % dimethyl glutarate, about 2 wt % dimethyl succinate, about 4 wt % methyl 5-oxocaproate, about 5 wt % methyl levulinate, and other constituents. The recovered product in this comparative example represents only about 20% of the anhydrous weight of COP Acid charged, which is very poor recovery compared to about 80 wt % recovery in Example 1 and only marginally greater than 13% recovery of Comparative Example 2. Furthermore, the methyl 6-hydroxycaproate concentration is only 6 wt %, compared to 40 wt in Example 1.

Example 4

Use of Methyl Ester Solvent from COP Acid as Solvent for Resins and Adhesives

Methyl ester solvent prepared as described in Example 1 is tested as a cleaning solvent for several commercially available adhesives. The adhesives tested, all purchased at retail, are: Gorilla Glue (1-part polyurethane adhesive), GE Silicone II Household Adhesive, and Loctite® Professional Extra Time Epoxy (two-part epoxy with about 60 minute "pot life"). Gorilla Glue and GE Silicone II Household Adhesive are used as received. Loctite® Professional Extra Time Epoxy is mixed according to package directions and allowed to "set" for 30 minutes before cleaning tests are performed. In each test, 0.5 g adhesive is mixed with 4.5 g solvent in a 20 mL glass vial and solubility behavior is noted. If the adhesive dissolves readily, that test is set aside for later observation; if the adhesive does not dissolve readily, that test is agitated by gentle rotation (~5 rpm) for 16 hours and solubility is noted. All tests are allowed to stand undisturbed to check for gellation or slow dissolution. Final observations of solubility are made after 1 week and are given in the following table. The ability to dissolve adhesives is useful to both households and industry. The ability to dissolve adhesives without gellation is important industrially because gellation can interfere with solvent recycle, such as when a solvent is used to flush clean equipment used in manufacture or application of adhesives or similar materials used on fabrication of composite structures. Results appear in Table 4, below.

TABLE 4

| Solvent | Gorilla Glue | GE Silicone II Household Adhesive | Loctite ® Professional Extra Time Epoxy |
|---|---|---|---|
| Methyl ester of Example 1 | Dissolves | Dissolves | Dissolves |
| INVISTA DBE ™ dibasic ester | Gels | Does not dissolve | Partially dissolves |
| Acetone | Gels | Dissolves | Dissolves |
| Dichloromethane | Gels | Swells/gels | Gels |
| Propylene glycol methyl ether | Dissolves | Does not dissolve | Gels |

Example 5

Use of Methyl Ester Solvent from COP Acid as Curing Agent for Sodium Silicate Binder Systems Sodium silicate premix (Part A) is prepared by diluting 1 part of sodium silicate (JT Baker, 41° Baume) with 1 part deionized water. For each test, 9.3 g of Part A are mixed with 0.7 g of curing agent (Part B) in a 20-mL glass vial. Each test mixture is mixed by rotating the glass vial, end over end, at about 8 rpm. The elapsed time in minutes is noted when the mixture first showed haziness, when the entire mixture becomes milky white, and finally when the contents are gelled to the point where the mixture is no longer mobile in the glass vial. Methyl ester from COP Acid is used as Part B and compared to DBE™ dibasic ester as Part B. DBE™ dibasic ester is a mixture of dimethyl succinate, dimethyl glutarate, and dimethyl adipate available from INVISTA which is commercially useful in various silicate binder systems. The results in Table 5 shown below indicate that methyl ester from COP acid functions similarly to DBE™ dibasic ester in curing sodium silicate solution.

TABLE 5

| Part B | Initial haze (time, min.) | Milky white (time, min.) | Gelled (time, min.) |
|---|---|---|---|
| Methyl ester from COP Acid | 30-40 | 45 | 35-50 |
| DBE ™ dibasic ester | 64 | 70-90 | 70-95 |

Example 6 n-Propyl Ester from COP Acid n-Propyl ester is prepared by the general method described in Example 1, except using n-propanol in place of methanol.

Thus, a mixture of 415 g of COP Acid (containing 32 wt % water, about 16 wt % adipic acid equivalent, and about 21 wt % 6-hydroxycaproic acid equivalent) and 1.33 g xylenesulfonic acid (XSA-90 from Nease Corporation) is dehydrated at 62 mm Hg absolute pressure and 133° C., yielding 144 g overheads.

n-Propanol is fed through a dip-tube below the surface of the reaction mixture at a rate of 3 mL/minute while maintaining reaction conditions of 125-140° C. and atmospheric pressure. Addition of n-propanol is continued until acid number is reduced to 2.8 mg KOH/g. Wet n-propanol is condensed and collected overhead. A total of 275 g n-propanol is fed and 180 g wet n-propanol is collected overhead.

The reaction mixture is placed under total reflux and 322 g n-propanol and 1.33 g sulfuric acid is added. Reaction is maintained under total reflux at atmospheric pressure, at a temperature of 102-103° C., for 9.2 hours, during which time oligomeric ester is converted to the desired monomeric n-propyl ester.

The reaction mixture resulting from the above sequence weighs 643 g and has an acid number of 3 mg KOH/g. This mixture is neutralized by addition of 8.5 g of a 25 wt % sodium methylate solution in methanol. After neutralization, the acid number is 0.12 mg KOH/g. The neutralized reaction mixture is distilled, using a 8-inch Vigreux column, at 160-175 mm Hg absolute pressure to remove n-propanol and low boilers. Pot temperature is initially about 61° C. but rises gradually as n-propanol and low boilers distill overhead. The propanol recovery stage is stopped when pot temperature reaches 153° C. at a pressure of 160 mm Hg absolute. Distillation is continued by reducing pressure. An 11 g fore-cut is taken, ending at 9 mm Hg absolute pressure and pot temperature of 128° C. Product is then distilled overhead starting at 6 mm Hg absolute pressure and 123° C. pot temperature and ending at 1 mm Hg absolute pressure and 169° C. pot temperature. The product weighs 194 g and the distillation heel weighs 116 g.

Analysis of the product shows that acid number is 0.59 mg KOH/g and water content is 0.03 wt %. The main organic constituents are identified by GC-MS and quantified by GC using an area percent analysis. Those components present at concentrations greater than 5 area % are: di-n-propyl glutarate (6.22 area %), di-n-propyl adipate (40.96 area %), and n-propyl 6-hydroxycaproate (33.52 area %).

Example 7

Ethyl Ester from COP Acid

Ethyl ester is prepared by the general method described in Example 1, except using ethanol in place of methanol.

Thus, a mixture of 415 g of COP Acid (containing 32 wt % water, about 16 wt % adipic acid equivalent, and about 21 wt % 6-hydroxycaproic acid equivalent) and 1.33 g xylenesulfonic acid (XSA-90 from Nease Corporation) is dehydrated at 61 mm Hg absolute pressure and 130° C., yielding 182 g overheads.

Ethanol is fed through a dip-tube below the surface of the reaction mixture at a rate of 2 mL/minute while maintaining reaction conditions of 113-130° C. and atmospheric pressure. Addition of ethanol is continued until acid number is reduced to 12.4 mg KOH/g. Wet ethanol is condensed and collected overhead. A total of 706 g ethanol is fed and 657 g wet ethanol is collected overhead.

The reaction mixture is placed under total reflux and 547 g ethanol and 1.33 g sulfuric acid is added. Reaction is maintained under total reflux at atmospheric pressure, at a temperature of 79-80° C., for 10.5 hours, during which time oligomeric ester is converted to the desired monomeric ethyl ester.

The reaction mixture resulting from the above sequence weighs 839 g and has an acid number of 13.01 mg KOH/g. This mixture is neutralized by addition of 44.1 g of a 25 wt % sodium methylate solution in methanol. After neutralization, acid number is 0.05 mg KOH/g. The neutralized reaction mixture is distilled, using a 8-inch Vigreux column, at 477-481 mm Hg absolute pressure to remove ethanol and low boilers. Pot temperature is initially about 66° C. but rises gradually as ethanol and low boilers distill overhead. The ethanol recovery stage is stopped when pot temperature reaches 118° C. at a pressure of 477 mm Hg absolute. Distillation is continued by reducing pressure. An 11.9 g fore-cut is taken, ending at 23.4 mm Hg absolute pressure and pot temperature of 133° C. Product is then distilled overhead ending at about 1 mm absolute pressure and pot temperature of 133° C. The product weighs 134 g and the distillation heel weighs 126 g.

Analysis of the product shows that acid number is 0.27 mg KOH/g and water content is 0.03 wt %. The main organic constituents are identified by GC-MS and quantified by GC using an area percent analysis. Those components present at concentrations greater than 5 area % are: diethyl glutarate (5.18 area %), diethyl adipate (41.97 area %), and ethyl 6-hydroxycaproate (34.86 area %).

Example 8

Isopropyl Ester from COP Acid

Isopropyl ester is prepared by the general method described in Example 1, except using isopropanol in place of methanol.

Thus, a mixture of 415 g of COP Acid (containing 32 wt % water, about 16 wt % adipic acid equivalent, and about 21 wt % 6-hydroxycaproic acid equivalent) and 1.33 g xylenesulfonic acid (XSA-90 from Nease Corporation) is dehydrated at 56 mm Hg absolute pressure and 147° C., yielding 183 g overheads.

Isopropanol is fed through a dip-tube below the surface of the reaction mixture at a rate of 2 mL/minute while maintaining reaction conditions of 125-131° C. and atmospheric pressure. Addition of isopropanol is continued until acid number is reduced to 5.24 mg KOH/g. Wet isopropanol is condensed and collected overhead. A total of 785 g isopropanol is fed and 696 g wet isopropanol is collected overhead.

The reaction mixture is placed under total reflux and 554 g isopropanol and 1.33 g sulfuric acid is added. Reaction is maintained under total reflux at atmospheric pressure, at a temperature of 83° C., for 9.7 hours, during which time oligomeric ester is converted to the desired monomeric isopropyl ester.

The reaction mixture resulting from the above sequence weighs 845 g and has an acid number of 2.7 mg KOH/g. This mixture is neutralized by addition of 8.82 g of 25 wt % sodium methylate solution in methanol, which reduces acid number to 0.78 mg KOH/g. An additional 2.54 g of sodium methylate solution is added, reducing acid number further, to 0.43 mg KOH/g. A final 1.42 g of sodium methylate solution is added before proceeding with distillation. The neutralized reaction mixture is distilled, using a 8-inch Vigreux column, at 215-230 mm Hg absolute pressure to remove isopropanol and low boilers. Pot temperature is initially about 53° C. but rises gradually as isopropanol and low boilers distill overhead. The isopropanol recovery stage is stopped when pot temperature reaches 130° C. at a pressure of 215 mm Hg absolute. Distillation is continued by reducing pressure. A 6.5 g fore-cut is taken, ending at about 1 mm Hg absolute pressure and pot temperature of 111° C. Product is then distilled overhead at 1 mm Hg absolute until pot temperature reaches 146° C. The product weighs 61 g and the distillation heel weighs 216 g.

Analysis of the product shows that acid number is 0.70 mg KOH/g and water content is 0.02 wt %. The main organic constituents are identified by GC-MS and quantified by GC using an area percent analysis. Those components present at concentrations greater than 5 area % are: diisopropyl glutarate (7.47 area %), diisopropyl adipate (49.63 area %), and isopropyl 6-hydroxycaproate (21.77 area %).

END-USE EXAMPLES

End Use Example 1

Solvents

Compositions of the present disclosure may be useful as solvents. For example, compositions of the present disclosure may be used as solvents in coatings, inks, adhesives, sealants, composites and binder systems. Examples of binder systems include those binders used in refractory manufacture (e.g., Vesuvius brand binder systems).

Compositions of the present disclosure may also be useful solvents for resin systems such as epoxy, phenoxy, styrenic (including copolymers such as those with maleic anhydride or acrylonitrile), acrylic or methacrylic, polyvinylbutyral, vinylidene fluoride, vinylic resins (e.g., vinyl chloride, vinyl acetate, etc.), polyurethane and polyurethane systems, and phenolic resins used in foundry binder systems.

Compositions of the present disclosure may be useful as solvents for polyurethane coatings, and especially for cleaning polyurethane processing and application equipment (e.g., PU coatings, foams, etc.).

Mixtures are prepared from various resins that may be used in coatings, inks, adhesives, sealants, composite and binder systems. Each mixture is prepared by combining 0.5 g of resin with 4.5 g ester solvent of the present disclosure in a 20 mL glass vial. Each mixture is agitated gently by rotating end-over-end at a slow rate (5-10 rpm) for 37 hours. Each mixture is then evaluated visually to determine the extent to which the resin has dissolved and given a rating where 1 indicates that the polymer dissolved completely, 2 indicates nearly complete dissolution, 3 indicates partial dissolution, and 4 indicates little or no dissolution. Results are summarized in the Table 6 and show that the ester solvent of the present disclosure has broad utility as a solvent for a wide variety of resins.

TABLE 6

| Polymer | Result |
| --- | --- |
| Dylark 132 SMA (styrene/maleic anhydride) | 1 |
| Elvacite 2046 (n-butyl/isobutyl methacrylate copolymer) | 1 |
| Epon 1001F (epoxy resin) | 1 |
| Epon 1007F (epoxy resin) | 1 |
| Epon 1009F (epoxy resin) | 1 |
| Formvar (polyvinyl butyral) | 1 |
| Magnum ABS (acrylonitrile/butadiene/styrene copolymer) | 1 |
| Phenoxy PKHH (bisphenol A/epichlorhydrin resin) | 1 |
| Phenolic resin for polyurethane binder system | 1 |
| Polyurethane adhesive | 1 |
| Polyurethane coating resin | 1 |
| Tyril 125 (styrene/acrylonitrile copolymer) | 1 |
| UCAR VMCA (vinyl chloride/vinyl acetate/maleic acid copolymer) | 1 |
| UCAR VYNS-3 (vinyl chloride/vinyl acetate resin) | 1 |
| Viton A (fluoropolymer) | 1 |
| VAMAC VMX 6466 (ethylene/methyl acrylate copolymer) | 2 |
| Kynar 7201 (vinylidene fluoride copolymer) | 3 |
| Merge 1981 poly(ethylene terephthalate/isophthalate) copolyester | 3 |
| Nordel 2522 (ethylene/propylene/1,4-hexadiene copolymer) | 3 |
| Styron 484 (polystyrene) | 3 |
| U-100 Polyacrylate | 3 |
| UCAR VYHH (bakelite vinyl solution resin) | 3 |

TABLE 6-continued

| Polymer | Result |
| --- | --- |
| Udel Polysulfone A-1975 | 3 |
| Viton B (fluoropolymer) | 3 |
| Viton GFLT Sheet (fluoropolymer) | 3 |
| Ultem 1000 (polyether imide) | 4 |
| Victrex (polyether sulfone) | 4 |

End Use Example 2

Reactive Diluents

Compositions of the present disclosure may be useful as reactive diluent solvent for polyurethane systems (coatings and foundry).

A phenolic resin for use in a 2-part foundry polyurethane binder system is dissolved in ester solvent of the present disclosure, then allowed to react with isocyanate in the conventional manner to form a cured binder. For comparison, the same phenolic resin is dissolved in the same amount of a conventional non-reactive solvent such as dibasic ester (DBE™ dibasic ester, available from INVISTA) and allowed to react with isocyanate in the same conventional manner to form a cured binder. The binders are allowed to cure completely. Each cured binder is extracted with methanol and the extracts analyzed to determine the amount of free solvent (ester solvent of the present disclosure or DBE™ dibasic ester) remaining in the cured binder. It is found that the amount of free solvent is less in the case of the ester solvent of the present disclosure compared to DBE™ dibasic ester.

A polyurethane coating is formulated using ester solvent of the present disclosure. A comparison coating is formulated using the same amount of DBE™ dibasic ester. Each coating formulation is evaluated for VOC content by EPA method 24. It is found that VOC content of the formulation made using ester solvent of the present disclosure is lower than that of the formulation made using DBE™ dibasic ester.

Without being bound by any theory, it is thought that hydroxyl groups present in the solvent of the present disclosure react with components of the polyurethane binder system or coating and are thereby immobilized in the binder or coating, whereas this does not occur with conventional (non-reactive) solvents such as DBE™ dibasic ester.

End Use Example 3

Solvents for Cleaning

Compositions of the present disclosure may be useful as solvents for cleaning. For example, compositions of the present disclosure may be used to clean apparatus used in manufacture, processing, blending, or application of resins or products containing resins listed above.

A metal knife is used to spread polyurethane adhesive, then immersed in ester solvent of the present disclosure and gently agitated. Polyurethane adhesive dissolves in the ester solvent and is removed from the knife. The ester solvent remains liquid, allowing it to be reused.

End Use Example 4

Solvents for Separation and Recycle of Polymers

Compositions of the present disclosure may be useful as solvents for separation and recycle of polymers.

A mixture of Ultem 1000 polyether imide and Phenoxy PKHH resin is treated with ester solvent of the present disclosure. It is found that the Phenoxy PKHH resin dissolves completely while the Ultem remains undissolved. The Ultem is recovered by simple filtration. Other combinations of polymers with differential solubility in the ester of the present disclosure may be separated in a similar manner.

End Use Example 5

Controlled Acid Function Release Agents

Compositions of the present disclosure may be useful as controlled acid function release agents, for example, as hardeners for:
a) in sodium silicate binder systems and sodium silicate binders used in foundry;
b) sodium silicate binders used in soil stabilization and chemical grouting;
c) sodium silicate materials used in drilling fluids (e.g., U.S. Pat. No. 7,226,895, which is incorporated herein by reference); and
d) sodium silicate binders used in binding waste metal-containing materials into briquettes (such as described in WO 200216659, which is incorporated herein by reference).

End Use Example 5A

Sand

A mixture of 4.65 g sodium silicate solution, 4.65 g water, and 0.7 g ester solvent of the present disclosure is coated uniformly onto 45.5 g "standard" Ottawa sand and allowed to cure, resulting in a bound mass of sand that holds it's shape but is still friable. Use of less (or no) water provides a stronger, less friable binder.

End Use Example 5B

Metal Briquettes

A mixture of sodium silicate and ester solvent of the present disclosure is combined with a mixture of metal scraps, including grindings, turnings, and filings, then pressed tightly into a mold and allowed to cure. The resulting briquette can be easily handled and recycled/re-melted to recover metal value.

End Use Example 5C

Soil Stabilization

A mixture of sodium silicate, water, and ester solvent of the present disclosure is injected under pressure into porous or granular soil and allowed to cure. The resulting silicate-reinforced section of soil has increased strength, stiffness, and reduced permeability and is useful as an underground barrier to impede flow of water or other liquids, and as a means to stabilize excavations against collapse.

End Use Example 5D

Soil Stabilization

A mixture of sodium silicate, water, and ester solvent of the present disclosure is injected into a porous section of earth being excavated or drilled. The sodium silicate is allowed to harden after which the porous section of earth is more resistant to collapse as excavation or drilling continues.

End Use Example 5E

Drilling Fluid

A drilling fluid system is prepared according to Example 1 of U.S. Pat. No. 7,226,895, except using the ester solvent of the present disclosure instead of "ethyl ester" of U.S. Pat. No. 7,226,895, which is incorporated herein by reference. Testing as described in Example 1 of U.S. Pat. No. 7,226,895 shows that the formulation using ester of the present disclosure performs similarly to the candidate formulation of Example 1, U.S. Pat. No. 7,226,895.

Comparative End Use Example 5F

Stabilization Performance

A mixture of sodium silicate, water, and a Composition C of the present disclosure is injected under pressure into porous or granular soil and allowed to cure. The procedure is repeated with sodium silicate and water mixtures but with the substitution of DBE™ dibasic ester, dimethylglutyrate, glycerol diacetate, ethylene glycol diacetate, and glycerol triacetate curing agents. All six test results indicate that resulting silicate-reinforced sections of soil have increased strength, stiffness, and reduced permeability and are useful as an underground barrier to impede flow of water or other liquids, and as a means to stabilize excavations against collapse.

End Use Example 6A

Monomers

A mixture of 1 part (molar) dimethyl terephthalate, 2 parts diethylene glycol, 0.25 parts ester solvent of the present disclosure and 0.5% by weight dibutyl tin dilaurate esterification catalyst is heated at 190° C. Pressure is reduced in stages to 100 mm Hg absolute. Methanol released by esterification reactions is taken off as vapor and condensed. The resulting reaction product is a mixed aromatic-aliphatic polyester polyol useful in polyurethanes.

End Use Example 6B Monomers

A mixture of 1 part by weight 1,4-butanediol, 3.39 parts by weight ester solvent of the present disclosure and 130 ppm by weight (based on weight of reactants) tetraisopropyl titanate esterification catalyst is heated to 182° C. Methanol released by esterification reactions is taken off as vapor and condensed. Pressure is reduced in stages to 6 mm Hg absolute while reaction temperature is maintained at about 180° C. for about 6 hours, during which time additional methanol of reaction is taken off and condensed. The resulting reaction product is an aliphatic polyester polyol useful in polyurethanes. The product is a liquid at 20° C. and has hydroxyl number of 60 mg KOH/g and viscosity of 602 cSt at 60° C.

End Use Example 6C

Monomers

A mixture of 1 part by weight neopentyl glycol, 3.10 parts by weight ester solvent of the present disclosure and 0.0002 parts by weight dibutyl tin dilaurate esterification catalyst is heated to 191° C. at atmospheric pressure. Methanol released by esterification reactions is taken off as vapor and condensed. Pressure is reduced in stages to about 30 mm Hg absolute while reaction temperature is maintained at about 185 to 190° C. for about 6 hours, during which time additional methanol of reaction is taken off and condensed. The resulting reaction product is an aliphatic polyester polyol useful in polyurethanes. Hydroxyl number is 44 mg KOH/g and viscosity is 441 cSt at 60° C. Color is 120 on the Pt/Co scale, similar to that of a butanediol-caprolactone polyol produced under similar reaction conditions (Comparative Example 6D below). However, this reaction product is liquid at 20° C. while the comparative caprolactone product is solid.

End Use Comparative Example 6D

A mixture of 1 part by weight 1,4-butanediol, 21.20 parts by weight caprolactone (Aldrich catalog number 704067) and 0.25% by weight dibutyl tin dilaurate esterification catalyst is heated to 193° C. at atmospheric pressure. Pressure is reduced in stages to 49 mm Hg absolute while reaction temperature is maintained at about 190° C. for about 2 hours. The resulting reaction product is an aliphatic polyester polyol. The product is solid at 20° C. and has hydroxyl number of 57 mg KOH/g and viscosity of 553 cSt at 60° C. Color is 117 on the Pt/Co scale.

End Use Examples 6E-6Q

The general procedures described in End Use Examples 6B through 6D are followed to prepare polyols from 1,4-butanediol and the ester solvent of the present disclosure, varying the relative amounts of 1,4-butanediol and ester to obtain polyols of different hydroxyl number (indicative of different molecular weight). Examples 6E-6J, 6P and 6Q represent polyols from ester solvent of the present disclosure. The same procedures are used to prepare various comparative polyols from 1,4-butanediol and various comparative starting materials, including caprolactone, dimethyl adipate (DBE™-6 dibasic ester from INVISTA), and a mixture of dimethyl succinate, dimethyl glutarate, and dimethyl adipate (DBE™ dibasic ester from INVISTA). These comparative examples are summarized in Table 7. Comparative examples C6K and C6L produce butanediol adipate polyols. Comparative examples C6M-C6O produce mixed butanediol succinate-glutarate-adipate polyols. Comparative example C6R produces a butanediol caprolactone polyol.

TABLE 7

| Example | Ester | Glycol | Ester/diol | visc@60 C. | OH | Form at RT | Catalyst |
|---|---|---|---|---|---|---|---|
| C6R | Caprolactone | 1,4-butanediol | 21.20 | 553 | 57.0 | solid | Sn |
| C6K | INVISTA DBE-6 | 1,4-butanediol | 1.83 | 4585 | 25.9 | solid | Ti |
| C6L | INVISTA DBE-6 | 1,4-butanediol | 1.74 | 1573 | 50.0 | solid | Ti |
| C6M | INVISTA DBE | 1,4-butanediol | 1.62 | 2491 | 43.9 | liquid | Ti |
| C6N | INVISTA DBE | 1,4-butanediol | 1.58 | 1708 | 56.5 | liquid | Ti |
| C6O | INVISTA DBE | 1,4-butanediol | 1.53 | 930 | 73.5 | liquid | Ti |
| 6E | Present invention from COP Acid hydroxyl number 182 saponification number 508) | 1,4-butanediol | 3.95 | 2851 | 19.5 | liquid | Ti |
| 6F | Same as above | 1,4-butanediol | 3.54 | 1061 | 41.5 | liquid | Ti |
| 6B | Same as above | 1,4-butanediol | 3.39 | 602 | 60.4 | liquid | Ti |
| 6G | Same as above | 1,4-butanediol | 3.27 | 500 | 69.9 | liquid | Ti |
| 6H | Same as above | 1,4-butanediol | 3.39 | 512 | 67.9 | liquid | Ti |
| 6I | Present invention from COP Acid hydroxyl number 168 saponification number 512) | 1,4-butanediol | 3.39 | 752 | 42.9 | liquid | Ti |
| 6J | Same as above | 1,4-butanediol | 2.95 | 304 | 88.2 | liquid | Sn |
| 6P | Present invention (from NVR) hydroxyl number 232 saponification number 444) | 1,4-butanediol | 5.16 | 356 | 48.2 | liquid | Ti |
| 6Q | Same as above | 1,4-butanediol | 4.78 | 281 | 61.3 | liquid | Ti |

It is evident from these results that, for a given hydroxyl number, polyols prepared from esters of the present disclosure have lower viscosity than polyols prepared from adipate (prepared from DBE™-6 dibasic ester) or mixed adipate/glutarate/succinate (prepared from mixed dimethyl adipate, dimethyl glutarate, and dimethyl succinate, i.e. DBE™ dibasic ester). Also, viscosity at 60° C. is comparable to that of caprolactone-based polyol, but polyols prepared from esters of the present disclosure are liquid at room temperature while the caprolactone-based polyols are solid at room temperature.

End Use Example 7A

Paint Removers

Compositions of the present disclosure may be useful as components of paint removers. They may be used in formulations for removal of paints and coatings from various surfaces.

A pine board is coated with latex (water-based) enamel. Another pine board is coated with alkyd (oil-based) enamel. Each coating is allowed to cure thoroughly, then treated with the ester solvent of the present disclosure. The coatings are softened, allowing them to be scraped from the wood and removed.

End Use Example 7B

Photoresist Strippers and Graffiti Removers

Compositions of the present disclosure may be useful as photoresist strippers in electronic manufacture and also for removing graffiti.

Permanent black marker (Marks-A-Lot® brand permanent marker) is applied to a plastic chip to simulate graffiti on a public surface. Ester solvent of the present disclosure is sprayed onto the defaced surface. The black marker is dissolved and lifted and can be removed by rubbing with a towel.

End Use Example 8

Cleaning Formulations

Compositions of the present disclosure may be useful in consumer, institutional, and industrial cleaning formulations, degreasers and hard surface cleaners.

A solution is prepared containing 9 parts (by weight) ester solvent of the present disclosure, 9 parts ethoxylated C9-C11 alcohol (Tomadol 91-8), 9 parts tripropylene glycol monomethyl ether, 2 parts adipic acid, and 71 parts water. This mixture is used to remove household soils from hard surfaces, including hard water/soap scum deposits commonly found in bathtubs and showers.

End Use Example 9

Soft Surface Cleaners

Compositions of the present disclosure may be useful as soft surface cleaners (carpet spotter, laundry spot pretreatment).

A section of carpet is soiled with latex wall paint as might accidentally occur when painting. The paint is allowed to dry so that it is difficult to remove using conventional carpet cleaner. The paint spots are pretreated by application of ester solvent of the present disclosure. The paint is softened and can be easily removed by conventional carpet cleaner.

End Use Example 10

Ink Cleaner/Remover

Compositions of the present disclosure may be useful as ink cleaners or ink removers.

A linseed oil-based lithographic ink (Branden Sutphin K0650VF Hi Gloss Dense Black) is applied to a ceramic tile and cured at 60° C. for 16 hours.

A small amount of ester solvent of the present disclosure is applied to the cured ink coating. The ink is dissolved.

A small amount of ester solvent of the present disclosure is applied uniformly to a nonwoven towel to form a wet wipe. The cured ink is rubbed gently with the wet wipe. The ink is dissolved and removed.

End Use Example 11

Comparative with Neat Ester Solvent

Composition Range E of Table 1 shows the composition of a solvent of the present disclosure. The methyl ester product obtained in Example 3 is an example of a solvent composition within Composition Range E. End Use Example 11 compares the performance of the methyl ester solvent (Example 3) with commercially available solvents: (a) ISOPAR™ M brand high boiling aliphatic solvent (manufactured by ExxonMobil Chemical Company of Baytown, Tex., USA); (b) neat methyl hydroxycaproate; and (c) neat dimethyladipate.

A linseed oil-based lithographic ink (Branden Sutphin K0650VF Hi Gloss Dense Black) is applied to a ceramic tile and cured at 60° C. for 16 hours.

A small amount of each solvent is applied to the cured ink coating. Methyl ester solvent (Example 3), as well as the neat methyl hydroxycaproate and the neat dimethyladipate effectively dissolve the cured ink coating. The high boiling aliphatic solvent (a) does not effectively dissolve the ink.

A small amount of each solvent is applied uniformly to a nonwoven towel to form a wet wipe. The cured ink is rubbed gently with the wet wipe. Again, the methyl ester solvent (Example 3), as well as the neat methyl hydroxycaproate and the neat dimethyladipate effectively dissolve the cured ink coating. The high boiling aliphatic solvent (a) does not effectively dissolve the ink.

It is surprising that methyl ester solvent (Example 3) performs equally with highly refined neat methyl hydroxycaproate and neat dimethyladipate because methyl ester solvent (Example 3) requires relatively less refining and contains alcohols.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±1%, ±2%, ±3%, ±4%, ±5%, ±6%, ±7%, ±8%, ±9%, or ±10%, or more of the numerical value(s) being modified. In addition, the phrase "about 'x' to 'y'" includes "about 'x' to about 'y'".

The foregoing disclosure constitutes a description of specific embodiments illustrating how embodiments of the present disclosure may be used and applied. Such embodiments are only exemplary. Embodiments of the present disclosure in its broadest aspects are further defined in the claims which follow. These claims and terms used therein are to be taken as variants of the present disclosure described herein. These claims are not restricted to such variants but are to be read as covering the full scope of the present disclosure implicit within the disclosure herein.

What is claimed is:

1. A composition comprising:
   a) about 10 to 60 weight percent methyl hydroxycaproate;
   b) about 20 to 80 weight percent dimethyl adipate;
   c) about 1 to 15 wt % of dimethyl glutarate;
   d) about 0.1 to 5 wt % of dimethyl succinate;
   e) about 0.1 to 7 wt % of at least one cyclohexanediol; and
   f) less than about 20 wt % oligomeric esters.

2. The composition of claim 1 further comprising about 0.1 to 7 wt % of methyl 5-hydroxyvalerate.

3. The composition of claim 1 further comprising:
   a) about 0.01 to 5 wt % of gamma butyrolactone; and
   b) about 0.01 to 10 wt % of methyl levulinate.

4. The composition of claim 1 that has been further processed to comprise about 10 to 60 weight percent methyl hydroxycaproate and about 0.01 to 2 weight percent dimethyl adipate.

5. The composition of claim 1 that has been further processed to comprise about 0.05 to 2 weight percent methyl hydroxycaproate and about 20 to 80 weight percent dimethyl adipate.

6. A solvent comprising the composition of claim 1.

7. A curing agent comprising the composition of claim 1.

8. A drilling mud comprising the composition of claim 1.

9. A paint remover comprising the composition of claim 1.

10. A photoresist stripper comprising the composition of claim 1.

11. A graffiti remover comprising the composition of claim 1.

12. A cleaner comprising the composition of claim 1.

13. The cleaner of claim 12, formulated for use in at least one end-use selected from the group consisting of: a consumer application, an institutional application, and an industrial cleaning application.

14. A method for dissolving a resin comprising contacting the resin with a solvent comprising the composition of claim 1.

15. The method of claim 14, wherein said resin is a component of at least one selected from the group consisting of a coating, an ink, an adhesive, a sealant, a composite and a binder system.

16. The method of claim 14 wherein said resin comprises a phenolic resin.

17. The method of claim 16 wherein said phenolic resin is a component of a refractory binder system or a foundry binder system.

18. The method of claim 14 wherein said resin is selected from the group consisting of: a phenolic resin, a polyester resin, a polyurethane resin, an epoxy resin, a phenoxy resin, a styrenic resin, a copolymer of a styrenic resin with maleic anhydride, a copolymer of a styrenic resin with an acrylonitril; a copolymer of a styrenic resin with a combination of maleic anhydride and an acrylonitrile, an acrylic resin, a methacrylic resin, a polyvinylbutyral resin, a vinylidene halide resin and a vinylic resin.

19. The method of claim 14 wherein said resin is selected from the group consisting of: a urethane, a urethane polymer, and a urethane copolymer.

20. A method for hardening a friable substrate comprising the steps of:
a) applying an aqueous solution comprising sodium silicate to said friable substrate;
b) curing said sodium silicate in contact with said friable substrate by applying a compositions of claim 1;
wherein the aqueous solution comprising sodium silicate and the composition of claim 1 are applied together, separately, or separately in sequence.

21. The method of claim 20 wherein said friable substrate is a component of a binder for foundry castings.

22. The method of claim 20 wherein said friable substrate is selected from the group consisting of: a soil, a grout, a drilling fluid, and a briquette.

23. The method of claim 20 wherein said friable substrate comprises waste metal.

24. The method of claim 20 wherein said hardening method produces a briquette containing waste metal.

25. A composition comprising:
a) about 10 to 60 weight percent methyl hydroxycaproate;
b) about 20 to 80 weight percent dimethyl adipate;
c) about 1 to 15 wt % of dimethyl glutarate;
d) about 0.1 to 5 wt % of dimethyl succinate;
e) about 0.1 to 7 wt % of cyclohexanediols;
f) about 0.1 to 7 wt % of methyl 5-hydroxyvalerate;
g) about 0.01 to 5 wt % of gamma butyrolactone; and
h) about 0.01 to 10 wt % of methyl levulinate.

26. A polyester prepared from the composition of claim 1.

27. A polyester polyol prepared from the composition of claim 1.

28. The solvent of claim 6, further comprising a co-solvent.

29. The solvent of claim 28, wherein the co-solvent is ethyl 3-ethoxypropionate.

30. The method of claim 14, wherein the solvent includes a co-solvent.

31. The method of claim 30, wherein the co-solvent is ethyl 3-ethoxypropionate.

32. The method of claim 18 wherein the vinylidene halide resin comprises vinylidene fluoride.

33. The method of claim 18 wherein the vinylic resin is selected from the group consisting of a vinyl chloride, a vinyl acetate and a combination thereof.

* * * * *